(12) United States Patent
Matsuura et al.

(10) Patent No.: US 8,336,490 B2
(45) Date of Patent: Dec. 25, 2012

(54) PLASMA PROCESSING APPARATUS

(75) Inventors: Hiroyuki Matsuura, Oshu (JP); Toshiki Takahashi, Oshu (JP); Kohei Fukushima, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/339,149

(22) Filed: Dec. 28, 2011

(65) Prior Publication Data

US 2012/0103525 A1 May 3, 2012

Related U.S. Application Data

(62) Division of application No. 12/230,468, filed on Aug. 29, 2008, now abandoned.

(30) Foreign Application Priority Data

Aug. 31, 2007 (JP) ................................ 2007-227005
Aug. 6, 2008 (JP) ................................ 2008-203574

(51) Int. Cl.
*C23C 16/00* (2006.01)
*C23F 1/00* (2006.01)
*H01L 21/306* (2006.01)
*H05B 31/26* (2006.01)

(52) U.S. Cl. ............ 118/723 I; 118/723 R; 118/723 IR; 156/345.35; 156/345.48; 156/345.49; 315/111.51

(58) Field of Classification Search ................. 156/345.43–345.48; 118/723 E, 118/723 ER, 723 I, 723 IR, 723 AN, 723 R; 315/111.21, 111.51
See application file for complete search history.

(56) References Cited

U.S. PATENT DOCUMENTS

| | | | |
|---|---|---|---|
| 5,487,785 A | 1/1996 | Horiike et al. | |
| 5,681,393 A | 10/1997 | Takagi | |
| 5,681,418 A | 10/1997 | Ishimaru | |
| 5,763,851 A | 6/1998 | Forster et al. | |
| 5,820,947 A * | 10/1998 | Itoh ............................... | 427/577 |
| 5,883,016 A | 3/1999 | Chan et al. | |
| 6,056,848 A | 5/2000 | Daviet | |
| 6,087,778 A * | 7/2000 | Benjamin et al. ........ | 315/111.51 |
| 2003/0029833 A1 | 2/2003 | Johnson | |
| 2005/0093460 A1 | 5/2005 | Kim et al. | |
| 2005/0199343 A1 | 9/2005 | Ohkuni | |
| 2006/0032443 A1 | 2/2006 | Hasebe et al. | |

(Continued)

FOREIGN PATENT DOCUMENTS

EP 0 489 407 A2 6/1992

(Continued)

OTHER PUBLICATIONS

Chinese Office Action issued on Aug. 4, 2010 in Chinese Application No. 200810171431.9 (with English translation).

(Continued)

*Primary Examiner* — Rakesh Dhingra
(74) *Attorney, Agent, or Firm* — Oblon, Spivak, McClelland, Maier & Neustadt, L.L.P.

(57) ABSTRACT

A vertical plasma processing apparatus for performing a plasma process on a plurality of target objects together at a time includes an activation mechanism configured to turn a process gas into plasma. The activation mechanism includes a vertically elongated plasma generation box attached to a process container at a position corresponding to a process field to form a plasma generation area airtightly communicating with the process field, an ICP electrode provided to the plasma generation box, and an RF power supply connected to the electrode.

17 Claims, 20 Drawing Sheets

U.S. PATENT DOCUMENTS

| | | |
|---|---|---|
| 2006/0266291 A1 | 11/2006 | Song et al. |
| 2006/0286817 A1 | 12/2006 | Kato |
| 2007/0243338 A1 | 10/2007 | Aslami et al. |
| 2008/0093024 A1 | 4/2008 | Abe et al. |
| 2008/0286980 A1 | 11/2008 | Ishimaru |

FOREIGN PATENT DOCUMENTS

| | | |
|---|---|---|
| JP | 4-290428 | 10/1992 |
| JP | 06-275608 | 9/1994 |
| JP | 11-317299 | 11/1999 |
| JP | 2002-280378 | 9/2002 |
| JP | 2005-142568 | 6/2005 |
| JP | 2006/073913 | 3/2006 |
| JP | 2006-270016 | 10/2006 |
| JP | 2007-42823 | 2/2007 |
| JP | 2008-53504 | 3/2008 |
| KR | 10-2005-0042701 | 5/2005 |
| KR | 10-2007-0057165 | 6/2007 |
| WO | WO2004108980 | 12/2004 |
| WO | WO 2006/027972 A1 | 3/2006 |
| WO | 2006/093136 | 9/2006 |
| WO | WO 2006/093136 A1 | 9/2006 |

OTHER PUBLICATIONS

Korean Office Action issued on Jun. 30, 2011 in Application No. 10-2008-0084805 (with English translation).

Japanese Office Action issued Feb. 21, 2012 in patent application No. 2008-203574 with partial English translation.

* cited by examiner

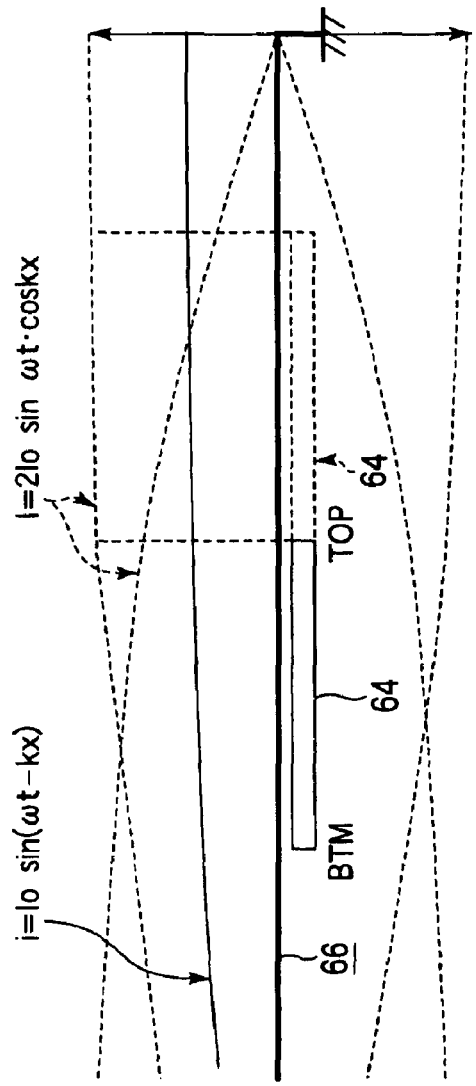
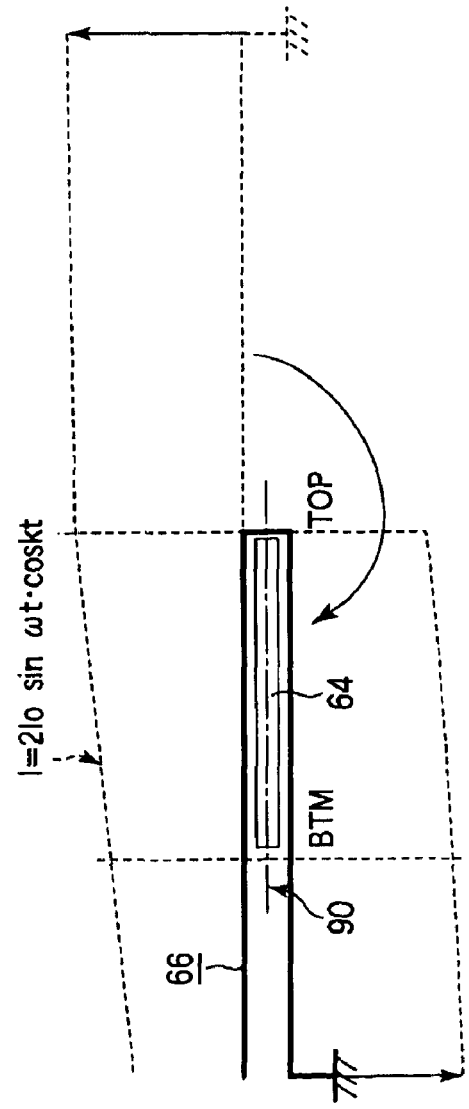
FIG.5A
FIG.5B

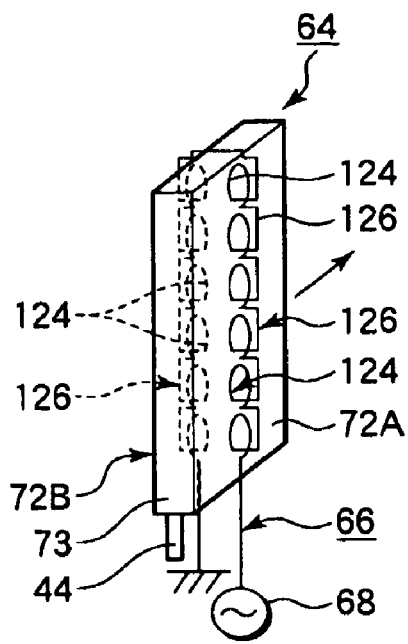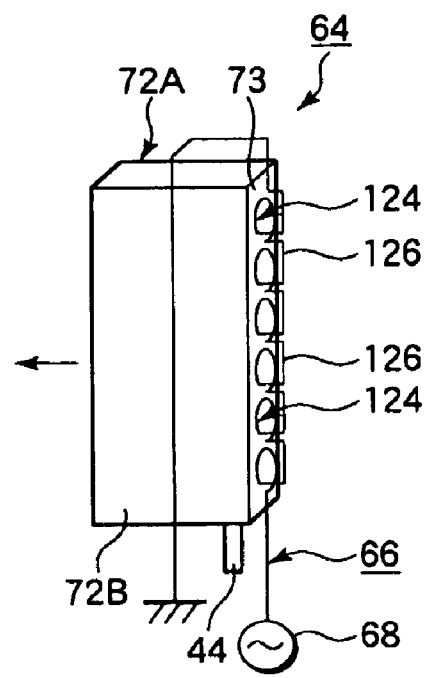
FIG.13A  FIG.13B
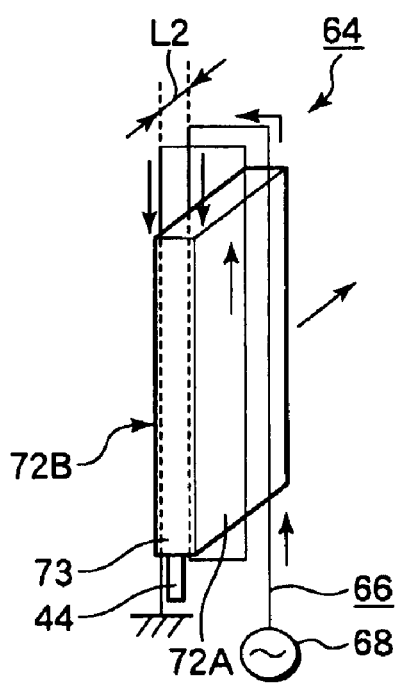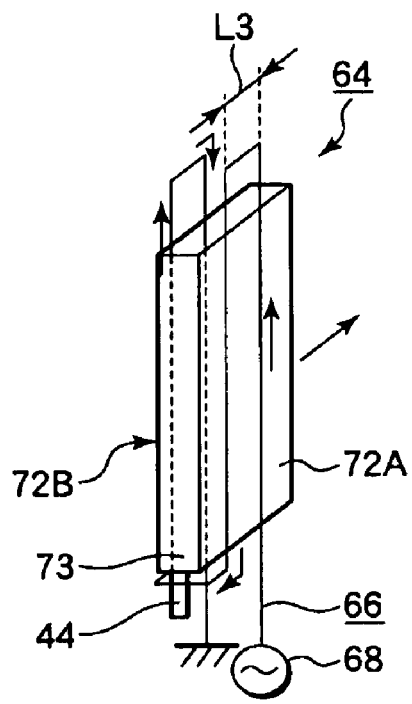
FIG.14A  FIG.14B

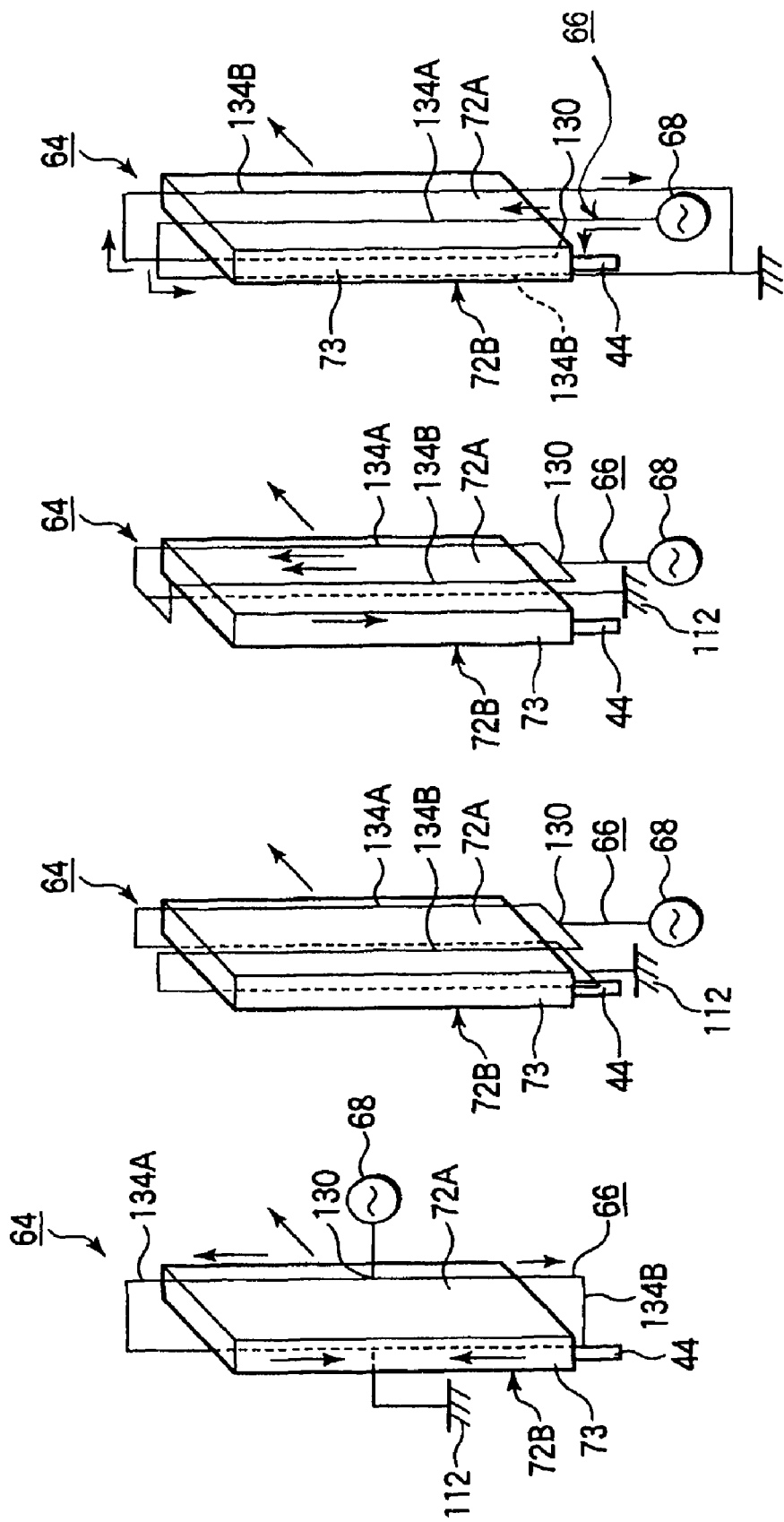

PLASMA PROCESSING APPARATUS

CROSS-REFERENCE TO RELATED APPLICATIONS

The present application is a divisional of U.S. application Ser. No. 12/230,468, filed on Aug. 29, 2008 (Abandoned), the entire content of which is incorporated herein by reference. U.S. application Ser. No. 12/230,468 (Abandoned) claims the benefit of priority under 35 U.S.C. 119 from Japanese Application No. 2007-227005 filed Aug. 31, 2007 and Japanese Application No. 2008-203574 filed Aug. 6, 2008.

BACKGROUND OF THE INVENTION

1. Field of the Invention

The present invention relates to a plasma processing apparatus for performing a process, such as a film formation process or etching process, by use of plasma on target objects, such as semiconductor wafers, and particularly to a technique utilized in the semiconductor process field. The term "semiconductor process" used herein includes various kinds of processes which are performed to manufacture a semiconductor device or a structure having wiring layers, electrodes, and the like to be connected to a semiconductor device, on a target object, such as a semiconductor wafer or a glass substrate used for an FPD (Flat Panel Display), e.g., an LCD (Liquid Crystal Display), by forming semiconductor layers, insulating layers, and conductive layers in predetermined patters on the target object.

2. Description of the Related Art

In manufacturing semiconductor devices for constituting semiconductor integrated circuits, a target object, such as a semiconductor wafer, is subjected to various processes, such as film formation, etching, oxidation, diffusion, reformation, annealing, and natural oxide film removal. US 2006/0286817 A1 discloses a semiconductor processing method of this kind performed in a vertical heat-processing apparatus (of the so-called batch type). According to this method, semiconductor wafers are first transferred from a wafer cassette onto a vertical wafer boat and supported thereon at intervals in the vertical direction. The wafer cassette can store, e.g., 25 wafers, while the wafer boat can support 30 to 150 wafers. Then, the wafer boat is loaded into a process container from below, and the process container is airtightly closed. Then, a predetermined heat process is performed, while the process conditions, such as process gas flow rate, process pressure, and process temperature, are controlled.

In order to improve the characteristics of semiconductor integrated circuits, it is important to improve the properties of insulating films used for semiconductor devices. Conventionally, $SiO_2$ films are mainly used as insulating films for semiconductor devices. However, in recent years, semiconductor integrated circuits are required to satisfy further improved integration and miniaturization levels. Under the circumstances, silicon nitride films ($Si_3N_4$ films) are used as insulating films for oxidation-resistant films, impurity-diffusion prevention films, and/or sidewall films of gate devices. Silicon nitride films are low in impurity diffusion coefficient and high in oxidation barrier property, and thus are extremely suitable for insulating films used in the applications described above.

Further, in recent years, semiconductor integrated circuits are required to have a higher operation speed. Owing to this demand, there is a proposal in which a silicon nitride film doped with an impurity, such as boron B, is formed to provide an insulating film having a far smaller dielectric constant that decreases the parasitic capacitance to a large extent (Jpn. Pat. Appln. KOKAI Publication No. 6-275608).

In addition to the demand described above, it is necessary to lower the temperature of processes. Owing to this demand, there has been proposed a plasma processing apparatus that performs a process by use of plasma to promote a reaction even at a lower wafer temperature (Jpn. Pat. Appln. KOKAI Publications No. 2006-270016 and No. 2007-42823).

FIG. 25 is a view schematically showing a vertical plasma processing apparatus, which is one of the conventional apparatuses described above. FIG. 26 is a sectional view showing part of a plasma box used in the apparatus shown in FIG. 25. As shown in FIG. 25, a cylindrical process container made of quartz and configured to vacuum-exhaust the internal atmosphere is disposed to accommodate semiconductor wafers (not shown) arrayed at intervals in the vertical direction. A plasma generation box 4 having a rectangular shape in a cross section is attached to the sidewall of the process container 2 along the vertical direction. A gas nozzle 5 for supplying a gas to be activated by plasma is disposed inside the box 4. As shown also in FIG. 26, two distinct plasma electrodes 6 are disposed to extend in the vertical direction on opposite sides outside the wall that defines the plasma generation box 4. An RF (radio frequency) power with, e.g., 13.56 MHz for plasma generation is applied across the two plasma electrodes 6 from an RF power supply 8.

With the arrangement described above, the two plasma electrodes 6 render an electrode pair of the parallel-plate type, so that plasma is generated by capacitive coupling when an RF power is applied across the plasma electrodes 6. The plasma thus generated activates a gas supplied into the plasma box 4, thereby generating active species or radicals that promote the reaction and so forth. A plasma processing apparatus of this type is generally called a plasma processing apparatus of the CCP (Capacitively Coupled Plasma) type.

According to a plasma processing apparatus of the CCP type, a reaction for, e.g., film formation is promoted by assistance of plasma, and so a predetermined plasma process can be performed even at a relatively low wafer temperature. However, the present inventors have found that plasma processing apparatuses of this type entail problems concerning particle generation and electron density.

BRIEF SUMMARY OF THE INVENTION

An object of the present invention is to provide a plasma processing apparatus that can prevent particle generation and can increase electron density.

According to an aspect of the present invention, there is provided a vertical plasma processing apparatus for performing a plasma process on a plurality of target objects together at a time, the apparatus comprising: a vertically elongated process container having a process field configured to accommodate the target objects and to be set in an airtightly state; a holder configured to support the target objects at intervals in a vertical direction inside the process container; a gas supply system configured to supply a process gas into the process container; an exhaust system configured to exhaust gas from inside the process container; and an activation mechanism configured to turn the process gas into plasma, wherein the activation mechanism comprises a vertically elongated plasma generation box attached to the process container at a position corresponding to the process field to form a plasma generation area airtightly communicating with the process field, an ICP (Inductively Coupled Plasma) electrode provided to the plasma generation box, and an RF (radio frequency) power supply connected to the electrode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 5A and 5B are views respectively showing electric current distribution states in the plasma generation box;

FIGS. 13A and 13B are schematic views showing main parts of apparatuses according to eighth and ninth modified embodiments of the present invention;

FIGS. 14A and 14B are schematic views showing main parts of apparatuses according to tenth and eleventh modified embodiments of the present invention;

FIGS. 17A to 17D are schematic views showing main parts of apparatuses according to eighteenth to twenty-first modified embodiments of the present invention;

DETAILED DESCRIPTION OF THE INVENTION

In the process of developing the present invention, the inventors studied problems of conventional techniques concerning plasma processing apparatuses of the capacitively coupled plasma type. As a result, the inventors have arrived at the findings given below.

Figure 25:
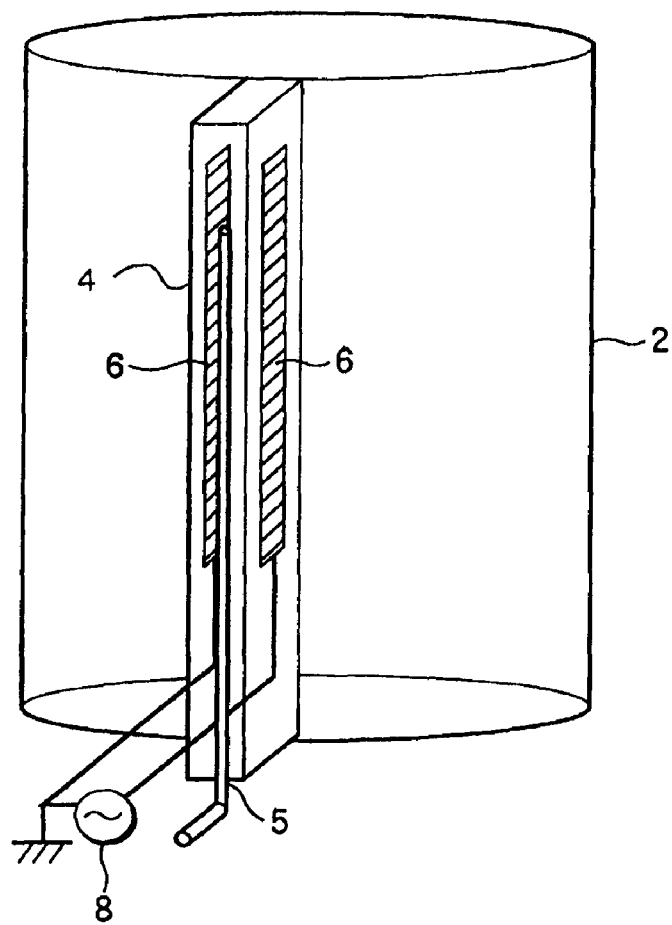
FIG. 25 is a view schematically showing a vertical plasma processing apparatus conventionally used.
Figure 26:
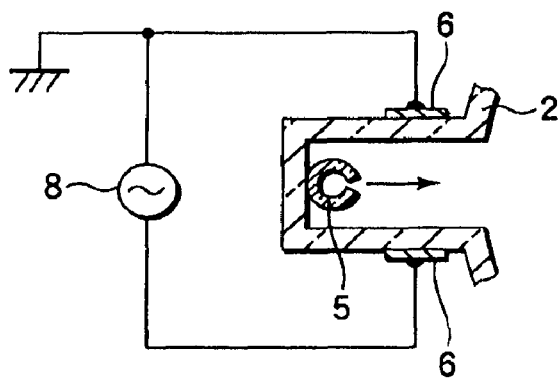
FIG. 26 is a sectional view showing part of a plasma box used in the apparatus shown in FIG. 25.

Specifically, in the case of the plasma processing apparatus of the capacitively coupled plasma type shown in FIGS. 25 and 26, the quartz inner wall of the plasma generation box 4 is etched by sputtering of ions in plasma accelerated by an electric potential difference applied to an ion sheath. Consequently, substances containing Si and O components of quartz material are deposited on the inner surface of the plasma generation box 4 and portions around the surface and may generate particles.

Further, where a larger power is applied to increase the electron density and thereby improve the process efficiency, the particle generation described above is abruptly increased due to the larger power. Accordingly, it is difficult to increase the electron density.

In this case, the applied RF power can be set to have a higher frequency to decrease the electron temperature and thereby suppress etching while increasing the radical density to promote the reaction. However, with an increase in frequency, the RF power supply needs to be larger and thereby drastically increases the apparatus cost. In light of this, as disclosed in International Publication No. WO 2006/093136, there has been proposed a plasma processing apparatus provided with an electrical discharge electrode formed of a U-shaped coil making one turn. However, the apparatus disclosed in this publication entails a difficulty in practical application.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

First Embodiment

Figure 1:
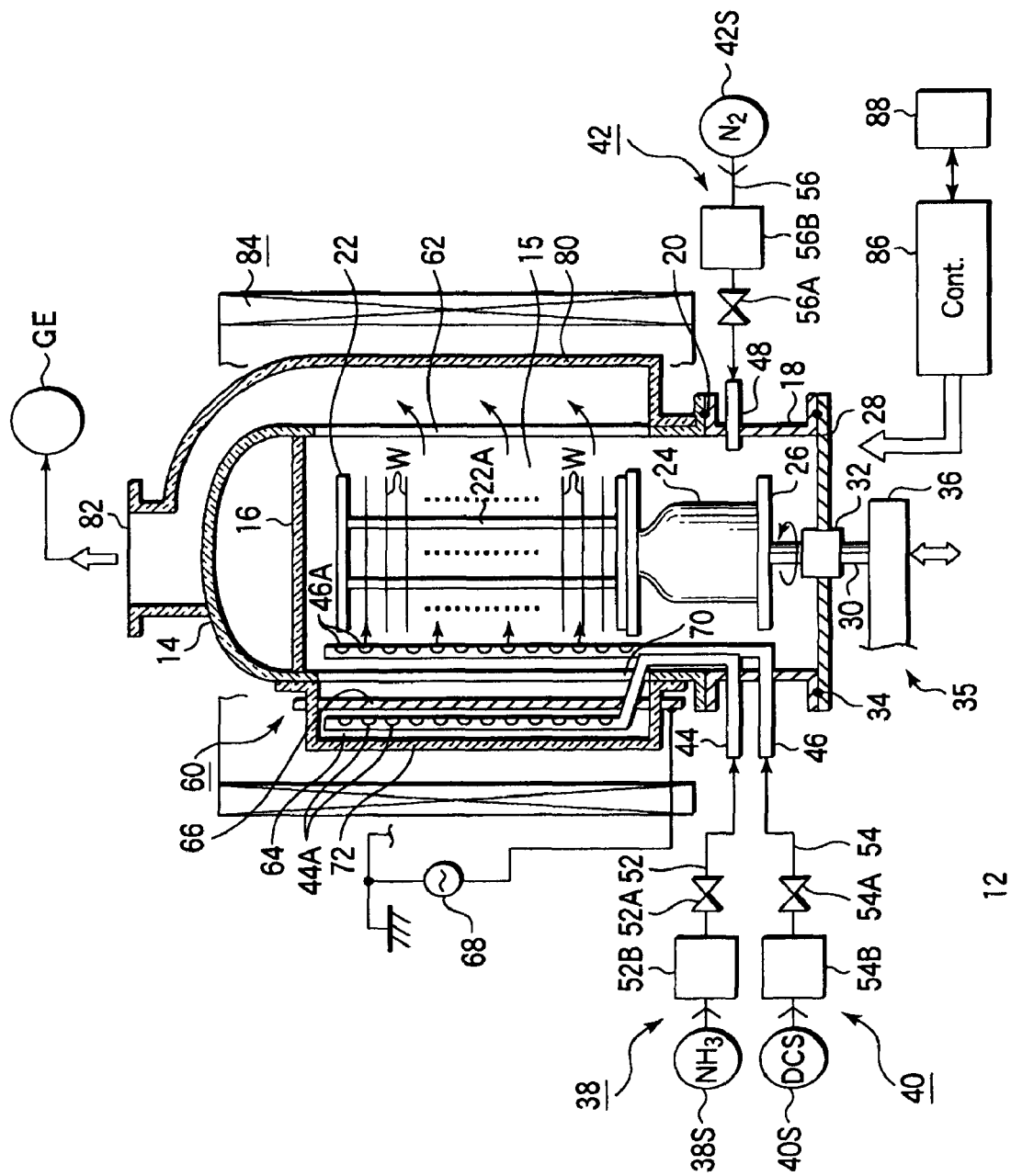
FIG. 1 is a sectional front view showing a vertical plasma processing apparatus according to a first embodiment of the present invention.
Figure 2:
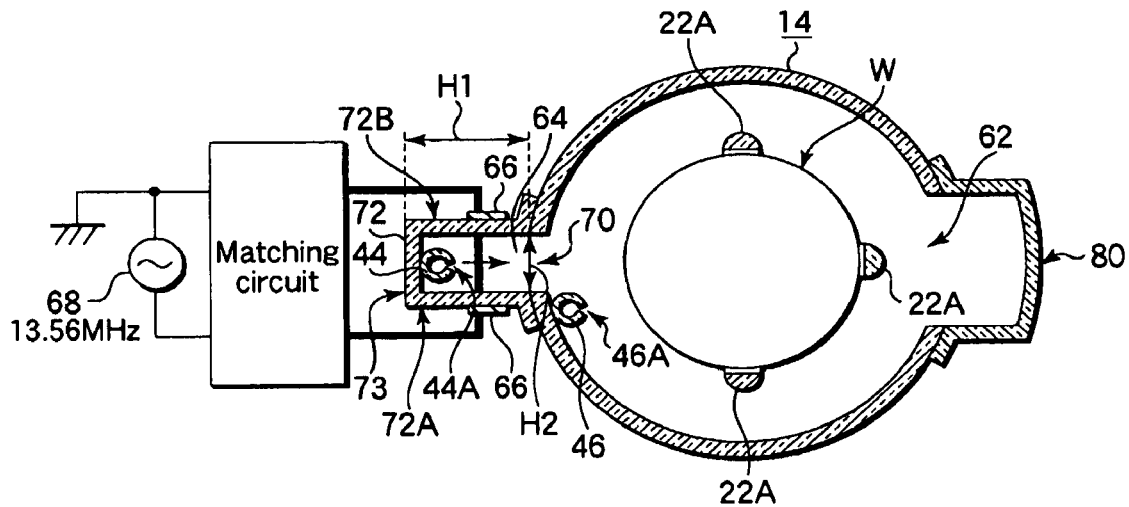
FIG. 2 is a sectional plan view showing part of the apparatus shown in FIG. 1 (excluding the heater)
Figure 3:
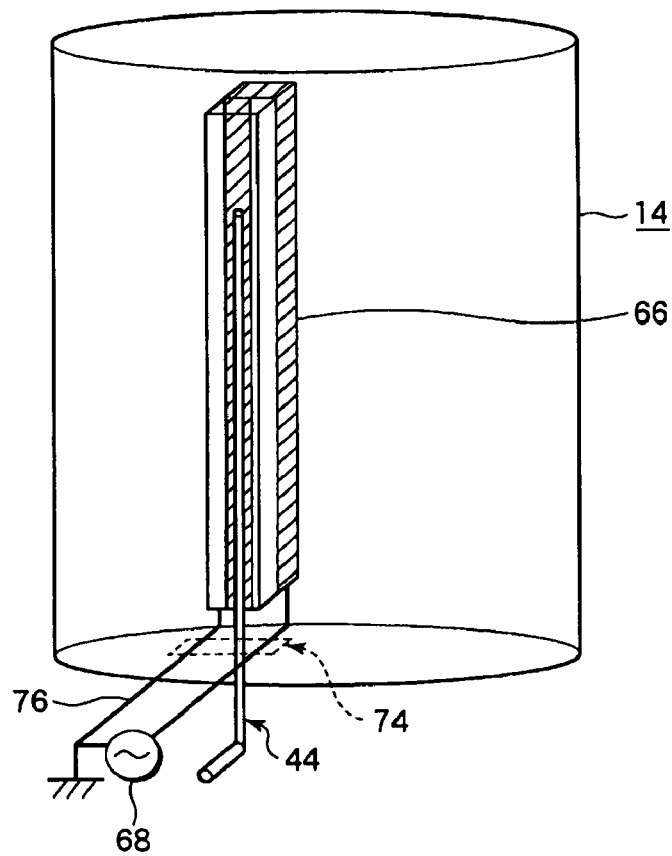
FIG. 3 is a schematic perspective view mainly showing an ICP electrode (which means an electrode that forms an inductive magnetic field for generating inductively coupled plasma, hereinafter) used in the apparatus shown in FIG. 1.
Figure 4:
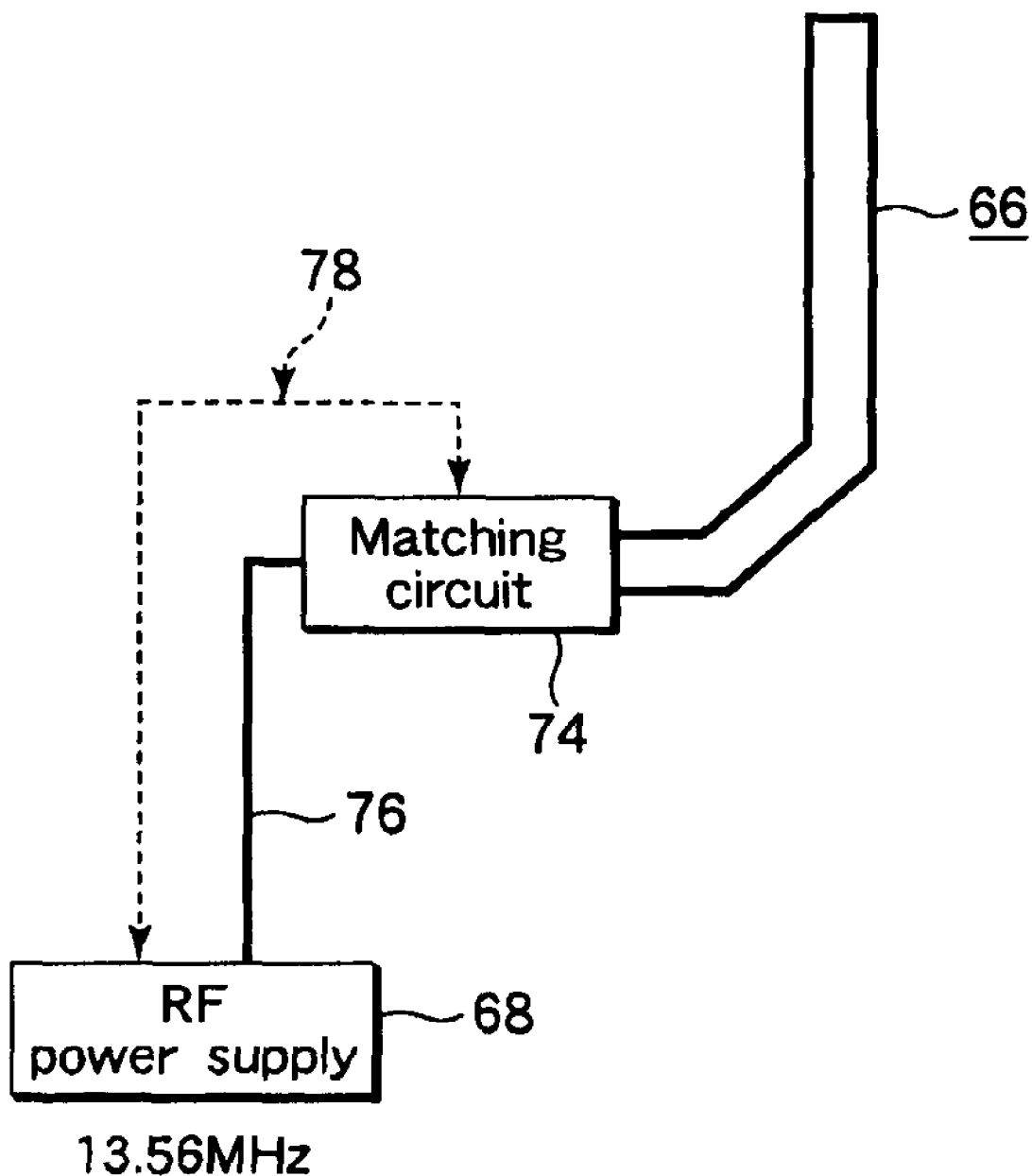
FIG. 4 is a block diagram showing a circuit including the ICP electrode.

FIG. 1 is a sectional front view showing a vertical plasma processing apparatus according to a first embodiment of the present invention. FIG. 2 is a sectional plan view showing part of the apparatus shown in FIG. 1 (excluding the heater). FIG. 3 is a schematic perspective view mainly showing an ICP electrode used in the apparatus shown in FIG. 1. FIG. 4 is a block diagram showing a circuit including the ICP electrode. The film formation apparatus 12 has a process field configured to be selectively supplied with a first process gas containing dichlorosilane (DCS) gas as a silane family gas, and a second process gas containing ammonia ($NH_3$) gas as a nitriding gas. The film formation apparatus 12 is configured to form a silicon nitride film on target objects in the process field, while activating the $NH_3$ gas by use of plasma.

The apparatus 12 includes a process container 14 shaped as a cylindrical column with a ceiling and an opened bottom, in which a process field 15 is defined to accommodate and process a plurality of semiconductor wafers (target objects) stacked at intervals in the vertical direction. The entirety of the process container 14 is made of, e.g., quartz. The top of the process container 14 is provided with a quartz ceiling plate 16 to airtightly seal the top. The bottom of the process container 14 is connected through a seal member 20, such as an O-ring, to a cylindrical manifold 18. The process container may be entirely formed of a cylindrical quartz column without a manifold 18 separately formed.

The manifold 18 is made of, e.g., stainless steel, and supports the bottom of the process container 14. A wafer boat 22 made of quartz is moved up and down through the bottom port of the manifold 18, so that the wafer boat 22 is loaded/unloaded into and from the process container 14. A number of target objects or semiconductor wafers W are stacked on the wafer boat 22 at intervals in the vertical direction. For example, in this embodiment, the wafer boat 22 has struts 22A that can support, e.g., about 50 to 100 wafers having a diameter of 300 mm at essentially regular intervals in the vertical direction.

The wafer boat 22 is placed on a table 26 through a heat-insulating cylinder 24 made of quartz. The table 26 is supported by a rotary shaft 30, which penetrates a lid 28 made of, e.g., stainless steel and used for opening/closing the bottom port of the manifold 18. The portion of the lid 28 where the rotary shaft 30 penetrates is provided with, e.g., a magnetic-fluid seal 32, so that the rotary shaft 30 is rotatably supported in an airtightly sealed state. A seal member 34, such as an O-ring, is interposed between the periphery of the lid 28 and the bottom of the manifold 18, so that the interior of the process container 14 can be kept sealed.

The rotary shaft 30 is attached at the distal end of an arm 36 supported by an elevating mechanism 35, such as a boat elevator. The elevating mechanism 35 moves the wafer boat 22 and lid 28 up and down integratedly. The table 26 may be fixed to the lid 28, so that wafers W are processed without rotation of the wafer boat 22.

A gas supply section is connected to the side of the manifold 18 to supply predetermined process gases to the process field 15 within the process container 14. Specifically, the gas supply section includes a second process gas supply circuit 38, a first process gas supply circuit 40, and a purge gas supply circuit 42. The first process gas supply circuit 40 is arranged to supply a first process gas containing a silane family gas, such as DCS (dichlorosilane) gas. The second process gas supply circuit 38 is arranged to supply a second process gas containing a nitriding gas, such as ammonia ($NH_3$) gas. The purge gas supply circuit 42 is arranged to supply an inactive gas, such as $N_2$ gas, as a purge gas. Each of the first and second process gases is mixed with a suitable amount of carrier gas, as needed. However, such a carrier gas will not be mentioned, hereinafter, for the sake of simplicity of explanation.

More specifically, the second and first process gas supply circuits 38 and 40 include gas distribution nozzles 44 and 46, respectively, each of which is formed of a quartz pipe which penetrates the sidewall of the manifold 18 from the outside and then turns and extends upward (see FIG. 1). The gas distribution nozzles 44 and 46 respectively have a plurality of gas spouting holes 44A and 46A, each set of holes being formed at predetermined intervals in the longitudinal direction (the vertical direction) over all the wafers W on the wafer boat 22. Each of the gas spouting holes 44A and 46A delivers the corresponding process gas almost uniformly in the horizontal direction, so as to form gas flows parallel with the wafers W on the wafer boat 22. The purge gas supply circuit 42 includes a short gas nozzle 48, which penetrates the sidewall of the manifold 18 from the outside.

The nozzles 44, 46, and 48 are connected to gas sources 38S, 40S, and 42S of $NH_3$ gas, DCS gas, and $N_2$ gas, respectively, through gas supply lines (gas passages) 52, 54, and 56, respectively. The gas supply lines 52, 54, and 56 are provided with switching valves 52A, 54A, and 56A and flow rate controllers 52B, 54B, and 56B, such as mass flow controllers, respectively. With this arrangement, $NH_3$ gas, DCS gas, and $N_2$ gas can be supplied at controlled flow rates.

A gas activation mechanism 60 is attached to the sidewall of the process container 14 in the vertical direction. The activation mechanism 60 includes a plasma generation box 64 extending in the longitudinal direction of the process container 14. An ICP electrode 66 is disposed along the plasma generation box 64 and is connected to an RF (radio frequency) power supply 68. On the side of the process container 14 opposite to the plasma generation box 64, a long narrow exhaust port 62 for vacuum-exhausting the inner atmosphere is formed by, e.g., cutting the sidewall of the process container 14 in the vertical direction.

Specifically, the plasma generation box 64 has a vertically long narrow opening 70 formed by cutting a predetermined width of the sidewall of the process container 14 in the vertical direction. The opening 70 is covered with a quartz cover 72 airtightly connected to the outer surface of the process container 14 by welding. The cover 72 has a vertical long and thin shape with a concave cross-section or U-shaped cross-section, so that it projects outward from the process container 14. Accordingly, the cover 72 comprises a pair of sidewalls 72A and 72B extending from the process container 14 in the radial direction and facing each other, and a backside wall that connects the outer ends of the sidewalls 72A and 72B to each other. The upper ends and lower ends of the sidewalls 72A and 72B are also closed by sealing walls.

With this arrangement, the plasma generation box 64 is formed such that it projects outward from the sidewall of the process container 14 and is opened on the other side to the interior of the process container 14. In other words, the inner space of the plasma generation box 64 communicates with the process field 15 within the process container 14. The opening 70 has a vertical length sufficient to cover all the wafers W on the wafer boat 22 in the vertical direction.

A long narrow belt-shaped electrode 66 is disposed on the outer surfaces of the opposite sidewalls of the cover 72 such that it makes approximately one turn in the longitudinal direction (vertical direction). As shown also in FIG. 3, this ICP electrode 66 is bent back at the top of the cover 72 so that it serves as a coil that makes approximately one turn. As shown also in FIG. 4, the proximal end side of the ICP electrode 66 is connected to an RF power supply 68 through a matching circuit 74 for impedance matching and further through an electric feed line 76. Adjustment signals 78 (see FIG. 4) are transmitted between the matching circuit 74 and RF power supply 68 to automatically adjust the impedance.

In FIG. 4, a coaxial cable is used as the electric feed line 76. One end of the ICP electrode 66 is grounded, while that portion of the electrode 66 on the distal end side which extends from the matching circuit 74 serves as an effective electrode. The RF power supply 68 is set to have a frequency of 13.56 MHz, but it may be set to have another frequency within a range of from 4 MHz to 27.12 MHz.

When an RF power is applied to the ICP electrode 66, plasma can be generated by an electromagnetic field of the inductively coupling type formed inside the plasma generation box 64. The plasma generation box 64 is designed to have a length of about 1 m, a width H1 (see FIG. 2) of about 20 to 100 mm, such as about 55 mm, and a thickness H2 of about 25 to 50 mm, such as 35 mm. The ICP electrode 66 is made of, e.g., a nickel alloy, and is designed to have a thickness of about 3 to 5 mm, a width of about 2 to 10 mm, and an overall length of about 4 to 5.5 m.

The gas distribution nozzle 44 of the second process gas is bent outward in the radial direction of the process container 14, at a position lower than the lowermost wafer W on the wafer boat 22. Then, the gas distribution nozzle 44 vertically extends at the deepest position (the farthest position from the center of the process container 14) in the plasma generation box 64. As shown also in FIG. 2, the gas distribution nozzle 44 is separated outward from an area sandwiched between the opposite portions of the electrode 66 (a position where the inductive magnetic field is most intense), i.e., a plasma generation area where the main plasma is actually generated. The second process gas containing $NH_3$ gas is spouted from the gas spouting holes 44A of the gas distribution nozzle 44 toward the plasma generation area. Then, the second process gas is selectively excited (decomposed or activated) in the plasma generation area, and is supplied in this state onto the wafers W on the wafer boat 22.

An insulating protection cover (not shown) made of, e.g., quartz is attached on and covers the outer surface of the cover 72. A cooling mechanism (not shown) is disposed inside the insulating protection cover (not shown) and comprises coolant passages respectively facing the electrode 66. The coolant passages are supplied with a coolant, such as cooled nitrogen gas, to cool the electrode 66.

At a position near and outside the opening 70 of the gas activation mechanism 60, the gas distribution nozzle 46 of the first process gas is disposed. Specifically, the gas distribution nozzle 46 extends upward on one side of the outside of the opening 70 (in the process container 14). The first process gas containing DCS gas is spouted from the gas spouting holes 46A of the gas distribution nozzle 46 toward the center of the process container 14.

On the other hand, the exhaust port 62, which is formed opposite the gas activation mechanism 60, is covered with an exhaust port cover member 80. The exhaust port cover member 80 is made of quartz with a U-shape cross-section and is attached by welding. The exhaust cover member 80 extends upward along the sidewall of the process container 14 and has a gas outlet 82 at the top of the process container 14. The gas outlet 82 is connected to a vacuum-exhaust system GE including a vacuum pump and so forth.

The process container 14 is surrounded by a heater 84, which is used for heating the atmosphere within the process container 14 and the wafers W. A thermocouple (not shown) is disposed near the exhaust port 62 in the process container 14 to control the heater 84.

The film formation apparatus 12 further includes a main control section 86 formed of, e.g., a computer, to control the entire apparatus. The main control section 86 can control a film formation process in accordance with process recipes stored in a storage section 88 thereof in advance, with reference to the film thickness and composition of a film to be formed. In the storage section 88, the relationship between the process gas flow rates and the thickness and composition of the film is also stored as control data in advance. Accordingly, the main control section 86 can control the elevating mechanism 35, gas supply circuits 38, 40, and 42, exhaust system GE, gas activation mechanism 60, heater 84, and so forth, based on the stored process recipes and control data. Examples of a storage medium for this purpose are a magnetic disk (flexible disk, hard disk (a representative of which is a hard disk included in the storage section 88), etc.), an optical disk (CD, DVD, etc.), a magneto-optical disk (MO, etc.), and a semiconductor memory.

Next, an explanation will be given of a film formation method (so called ALD or MLD film formation) performed in the apparatus shown in FIG. 1. In this film formation method, a silicon nitride film is formed on semiconductor wafers by ALD or MLD. In order to achieve this, a first process gas containing dichlorosilane (DCS) gas as a silane family gas and a second process gas containing ammonia ($NH_3$) gas as a nitriding gas are selectively supplied into the process field 15 accommodating wafers W. Specifically, a film formation process is performed along with the following operations.

At first, the wafer boat 22 at room temperature, which supports a number of, e.g., 50 to 100, wafers having a diameter of 300 mm, is loaded into the process container 14 heated at a predetermined temperature, and the process container 14 is airtightly closed. Then, the interior of the process container 14 is vacuum-exhausted and kept at a predetermined process pressure, and the wafer temperature is increased to a process temperature for film formation. At this time, the apparatus is in a waiting state until the temperature becomes stable. Then, while the wafer boat 22 is rotated, the first and second process gases are intermittently supplied from the respective gas distribution nozzles 46 and 44 at controlled flow rates. A cycle of alternately supplying the first and second process gases with a gap period (purge period) interposed therebetween is repeated a number of times, and thin films of silicon nitride formed by respective cycles are laminated, thereby arriving at a silicon nitride film having a target thickness.

Specifically, the first process gas containing DCS gas is supplied from the gas spouting holes 46A of the gas distribution nozzle 46 to form gas flows parallel with the wafers W on the wafer boat 22. While being supplied, the DCS gas is activated by the heating temperature to the process field 15, and molecules of the DCS gas and molecules and atoms of decomposition products generated by decomposition thereof are adsorbed on the wafers W.

On the other hand, the second process gas containing $NH_3$ gas is supplied from the gas spouting holes 44A of the gas distribution nozzle 44 to form gas flows parallel with the wafers W on the wafer boat 22. When the second process gas is supplied, the RF power supply 68 of the gas activation mechanism 60 is set in the ON-state over a period of the entirety or part of the supply. At this time, the output of the RF power 68 is set to be within a range of, e.g., 50 W to 3 kW.

When the gas activation mechanism 60 is set in the ON-state, the second process gas is excited and partly turned into plasma when it passes through the plasma generation area between the opposite portions of the electrode 66. At this time, for example, radicals (activated species), such as N*, NH*, $NH_2$*, and $NH_3$*, are produced (the symbol "*" denotes that it is a radical). The radicals flow out from the opening 70 of the gas activation mechanism 60 toward the center of the process container 14, and are supplied into gaps between the wafers W in a laminar flow state.

The radicals react with molecules and so forth derived from the DCS gas and adsorbed on the surface of the wafers W, so that a thin film of silicon nitride is formed on the wafers W. Alternatively, when DCS gas flows onto radicals derived from $NH_3$ gas and adsorbed on the surface of the wafers W, the same reaction is caused, so a silicon nitride film is formed on the wafers W.

The plasma generation box 64 is provided with the ICP electrode 66, in place of CCP electrodes of the parallel-plate type used in conventional apparatuses, to generate plasma in the plasma generation area. In this case, plasma is generated by an electromagnetic field formed by the electrode 66, while the ion sheath has a smaller electric potential difference. Consequently, ions in the plasma are less accelerated, and so the inner surface of the cover 72 is prevented from being etched by sputtering of ions. This makes it possible to significantly decrease particle generation that may deteriorate the yield of semiconductor devices.

Further, since the ICP electrode 66 is used, the radical density can be increased without raising the RF power and/or frequency, and so the plasma process can be efficiency performed. In other words, a larger power can be applied while the particle generation is suppressed and the electron density is increased, thereby making the plasma process more efficient.

Next, an explanation will be given of an electric current distribution state formed by the ICP electrode 66 inside the plasma generation box 64. FIGS. 5A and 5B are views respectively showing electric current distribution states in the plasma generation box. FIG. 5A shows an electric current state formed where the ICP electrode 66 is extended linearly straight. FIG. 5B shows an electric current state formed where the ICP electrode 66 is bent back at one end (the upper end) of the plasma generation box 64. In FIGS. 5A and 5B, "BTM" denotes a portion corresponding to the bottom of the wafer boat 22, and "TOP" denotes a portion corresponding to the top of the wafer boat 22.

In this example, the RF power has a frequency of 13.56 MHz (wavelength=about 22 m), the ICP electrode 66 has a length of 4 m, and the plasma generation box 64 has a length of 1 m. The ICP electrode 66 is grounded at one end, at which the electric current is reflected. In FIG. 5A, the bold line at the center represents the ICP electrode 66, and the right side thereof is the grounded end. The traveling wave "i" of the electric current indicated with a solid line is expressed by the following formula.

$$i = I_0 \sin(\omega t - kx)$$

In this formula, "$I_0$" is amplitude, "$\omega$" is angular velocity, "t" is time, "k" is a positive number, and "x" is a position in the horizontal direction in FIG. 5A.

The reflection wave "i'" of the electric current is expressed by the following formula.

$$i' = I_0 \sin(\omega t + kx)$$

At this time, the standing wave "I" of the electric current indicated with broken lines is expressed by the following formula.

$$I = 2I_0 \sin \omega t \cap \cos kx$$

On the other hand, as in this embodiment, where the ICP electrode 66 is bent back at one end (the upper end) of the plasma generation box 64, the standing wave of the electric current renders a state as shown in FIG. 5B. In FIG. 5B, the thickness of the plasma generation box 64 is ignored. In this case, the electric field along the central axis 90 of the plasma generation box 64 has a very small unevenness of about ±2 to 3% between TOP and BTM.

This is due to the following reason. Specifically, the ICP electrode 66 is bent back at one end (TOP side) of the plasma generation box 64, so that the opposite portions of the electrode are symmetrically present on the opposite sides of the box 64. In this case, the electric field formed along the central axis 90 of the box 64 is an overlap of electric fields respectively formed by the opposite portions of the electrode 66.

As described above, where the ICP electrode 66 is bent back to serve as a coil that substantially makes one turn, electric fields formed thereby are overlapped with each other. In this case, the intensity of the electric field less drops from the electricity feed side to the ground side, and so the electric field inside the plasma generation box 64 becomes uniform.

In the embodiment described above, the RF power is set to have a frequency of 13.56 MHz, but it may be set to have another frequency within a range of from 4 MHz to 27.12 MHz, as described above. Where the frequency is lower than 4 MHz, the plasma density becomes too low and thereby deteriorates the throughput, while the electron temperature becomes too high to achieve suppression of plasma damage, which is a main purpose of this mechanism. On the other hand, where the frequency is higher than 27.12 MHz, an ill effect of the standing wave becomes prominent due to the shorter RF wavelength, and makes it difficult to generate uniform plasma in the vertical direction inside the plasma generation box 66.

Figure 6:
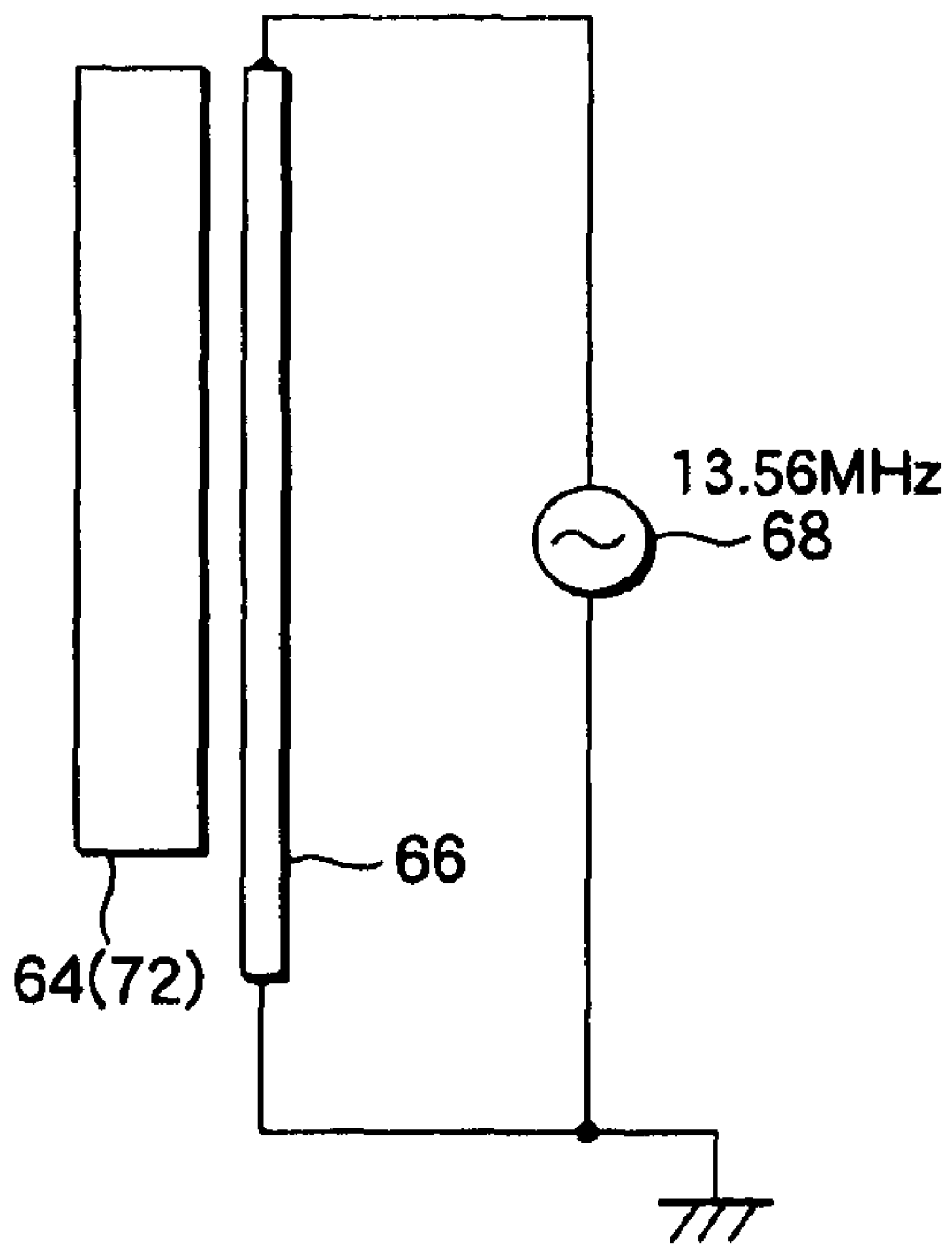
FIG. 6 is a schematic view showing an electrode making a half turn along only one side of the plasma generation box.

In this embodiment, the ICP electrode 66 is disposed to make approximately one turn around the plasma generation box 64, but the electrode 66 may be disposed to make a plurality of turns. Alternatively, as shown in the schematic view of FIG. 6, the electrode 66 may be disposed to make a half turn along only one side of the plasma generation box 64.

In this embodiment, the plasma generation box 64 is disposed outside the process container 14 and is elongated in the vertical direction. Alternatively, where a sufficiently large space is present inside a process container 14, a plasma generation box 64 may be disposed inside the process container.

Figure 7:
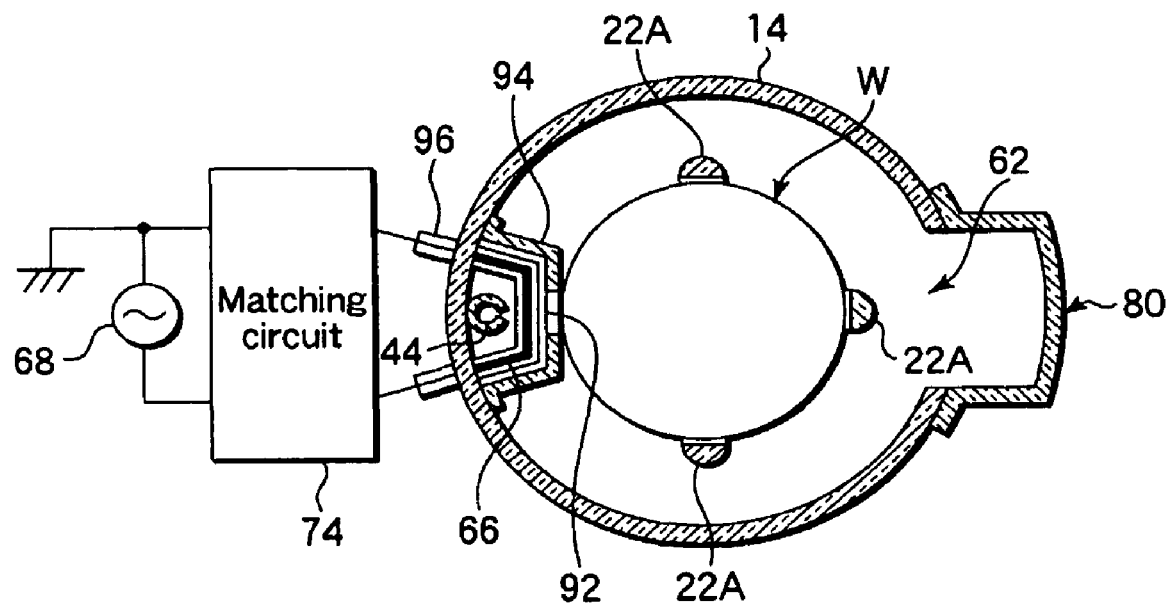
FIG. 7 is a sectional plan view showing a process container provided with a plasma generation box inside the process container.
Figure 8:
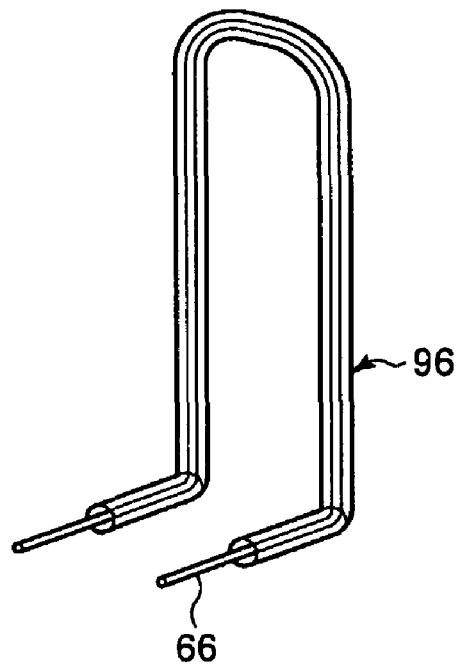
FIG. 8 is a perspective view showing an ICP electrode used for the plasma generation box shown in FIG. 7.

FIG. 7 is a sectional plan view showing a process container provided with a plasma generation box inside the process container. FIG. 8 is a perspective view showing an ICP electrode used for the plasma generation box shown in FIG. 7.

As shown in FIG. 7, a process container 14 is provided with a plasma generation box 94 made of quartz and attached by welding on the inner surface. The box 94 is elongated in the vertical direction and has a slit 92 on the front side. A gas distribution nozzle 44 of the second process gas is disposed inside the plasma generation box 94. As shown also in FIG. 8, an ICP electrode 66 is enveloped in an quartz protection pipe 96 and is disposed inside the plasma generation box 94 to make one round (one turn) in the vertical direction. This structure can also exhibit the same effect as the embodiment described above.

Figure 9A:
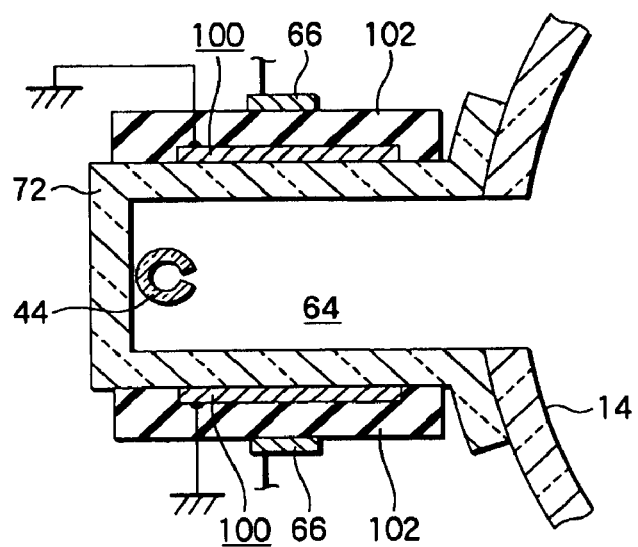
FIGS. 9A to 9C are enlarged views each showing part of a plasma generation box provided with an electrostatic shield.
Figure 9B:
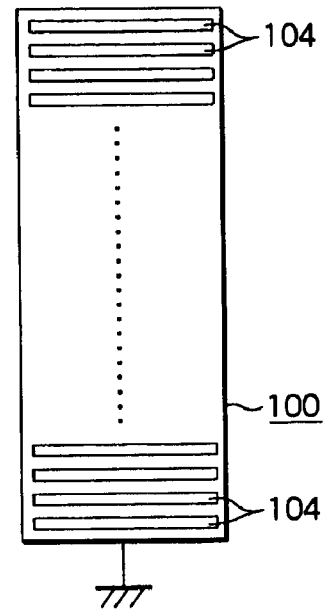
Figure 9C:
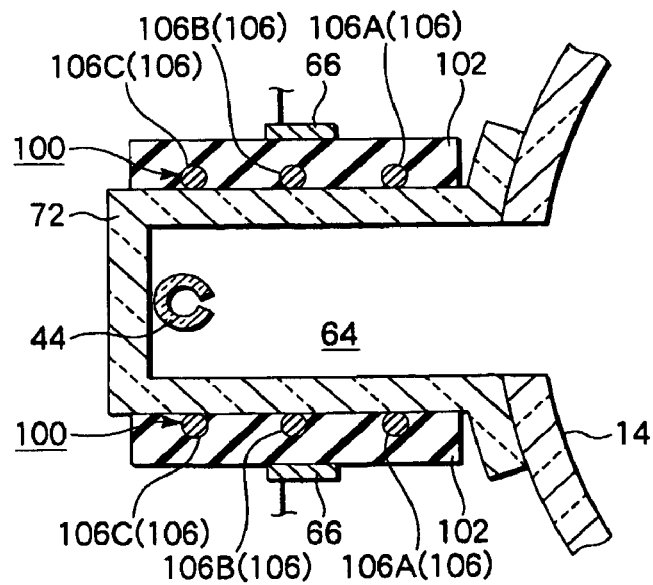

In order to decrease capacitive coupling, an electrostatic shield may be disposed at a position corresponding to the ICP electrode 66. Such an electrostatic shield is also called Faraday shield. FIGS. 9A to 9C are enlarged views each showing part of a plasma generation box provided with an electrostatic shield. FIG. 9A shows a first example of the electrostatic shield, and FIG. 9B is a plan view of the electrostatic shield shown in FIG. 9A. FIG. 9C shows a second example of the electrostatic shield.

As shown in FIG. 9A, an electrostatic shield 100 is disposed on each side surface of the plasma generation box 64 or cover 72 and is grounded. The electrostatic shield 100 is covered with an insulating plate 102, on which the ICP electrode 66 is disposed to be electrically insulated from the electrostatic shield 100.

The electrostatic shield 100 is interposed between the plasma generation box 64 (each side surface of the cover 72) and the ICP electrode 66, and extends in the vertical direction. The electrostatic shield 100 is made of a conductive material, such as the same material as the ICP electrode 66. More specifically, the electrostatic shield 100 has a long narrow rectangular shape with a width of, e.g., about 10 to 30 mm. The electrostatic shield 100 has a number of opening slits 104 arrayed in the vertical direction and each having a horizontally elongated rectangular shape. Each of the opening slits 104 has a vertical length of about 5 to 30 mm and a horizontal length of about 30 to 45 mm, while their pitch is about 7 to 35 mm.

The two electrostatic shields 100 respectively disposed on the right and left sides of the plasma generation box 64 may be connected to each other at the top or may be separated from each other. In any case, the electrostatic shields 100 are grounded. The insulating plate 102 is made of, e.g., quartz or alumina, and has a thickness of about 2 to 5 mm.

The electrostatic shield 100 disposed as described above allows a magnetic field of the inductively coupling type formed by the ICP electrode 66 to be coupled with plasma while capacitive coupling due to an electric field is further decreased. Consequently, the inner wall of the plasma generation box 64 is prevented from suffering etching damage due to ions generated in the plasma.

In place of the electrostatic shield 100 formed of a flat plate having the opening slits 104, an electrostatic shield 100 comprising a plurality of rod-like electrodes 106 may be used, as shown in FIG. 9C. The electrostatic shield 100 shown in FIG. 9C includes three rod-like electrodes 106A, 106B, and 106C extending in the vertical direction and arrayed side by side. The central rod-like electrode 106B is set to align with the position of the ICP electrode 66, and the other rod-like electrodes 106A and 106C are separated therefrom by a certain distance on the both sides. This structure can also exhibit the same effect as the structure shown in FIG. 9A. The number of rod-like electrodes 106 is not limited to a specific one.

In the embodiment described above, the present invention is applied to a case where a silicon nitride film is formed in the plasma processing apparatus, but this is not limiting. The present invention is applicable to any plasma processing apparatus for forming a thin film. For example, the plasma processing apparatus described above may be modified to form a silicon oxide film. As one example of such modifications, where a silicon oxide film is formed by an ALD (Atomic Layer Deposition) method on 50 to 150 wafers having a diameter of 300 mm, an Si organic source having any one of univalent to trivalent amino groups may be used as a silicon source.

For example, the univalent source is exemplified by diisopropylaminosilane [$SiH_3(N(i-C_3H_7)_2)_2$], the bivalent source is exemplified by bisdiethylaminosilane [$SiH_2(N(C_2H_5)_2)_2$], and the trivalent source is exemplified by trisdimethylaminosilane: 3DMAS ($SiH(N(CH_3)_2)_3$). Oxygen may be used as an oxidizing agent, such that the oxygen is activated by inductively coupled plasma according to the present invention to generate oxygen active species (oxygen radicals).

For example, as a specific apparatus used for this purpose, the plasma processing apparatus shown in FIG. 1 may be modified such that the second process gas supply circuit 38 is configured to supply $O_2$ gas in place of $NH_3$ gas and oxygen active species are generated by inductively coupled plasma.

Further, the first process gas supply circuit 40 is configured to supply an Si organic source gas in place of DCS gas as described above.

A cycle of alternately and intermittently supplying the Si organic source gas and the oxygen gas activated by plasma onto wafers W (from one organic source supply to the next organic source supply) is repeated a number of times, and atomic layers formed by respective cycles are laminated, thereby arriving at a silicon oxide film having a target thickness.

For example, where the cycle is repeated 150 to 1,200 times, a silicon oxide film is formed to have a film thickness of 30 to 250 nm. In this case, the film formation temperature is set to be within a range of from room temperature (about 27° C.) to about 300° C. Particularly, where diisopropylaminosilane, which is univalent, is used, the film formation can be performed at room temperature. Accordingly, in this case, unlike the case described above of forming a silicon nitride film, the heater 84 can be excluded from the plasma processing apparatus 12.

In the experiment, by use of univalent diisopropylaminosilane as the Si organic source, comparison was made between film formation processes performed in a plasma processing apparatus provided with conventional CCP electrodes and in a plasma processing apparatus provided with an ICP type electrode according to this embodiment. As a result, the conventional apparatus rendered an average particle increase of 100 per wafer while the embodiment apparatus rendered an average particle increase of 10 per wafer (the total number of particles of 0.08 μm or more). Accordingly, it has been found that the present invention is particularly advantageous in terms of the effect of suppressing particle generation. In this experiment for comparison, the RF power for generating oxygen plasma was set at 250 watts.

Modified Embodiments

Next, an explanation will be given of plasma processing apparatuses according to modified embodiments of the present invention, while focusing on the ICP electrode 66. In these modified embodiments, only the terminal side of the RF power supply 68 connected to the electrode 66 is shown and the grounded terminal side of the RF power supply 68 is not shown. In modified embodiments where electrode portions having similar patters are respectively disposed along the opposite sides of the plasma generation box 64, the patterns substantially form a symmetric shape with respect to the intermediate portion.

First Modified Embodiment

Figure 10B:
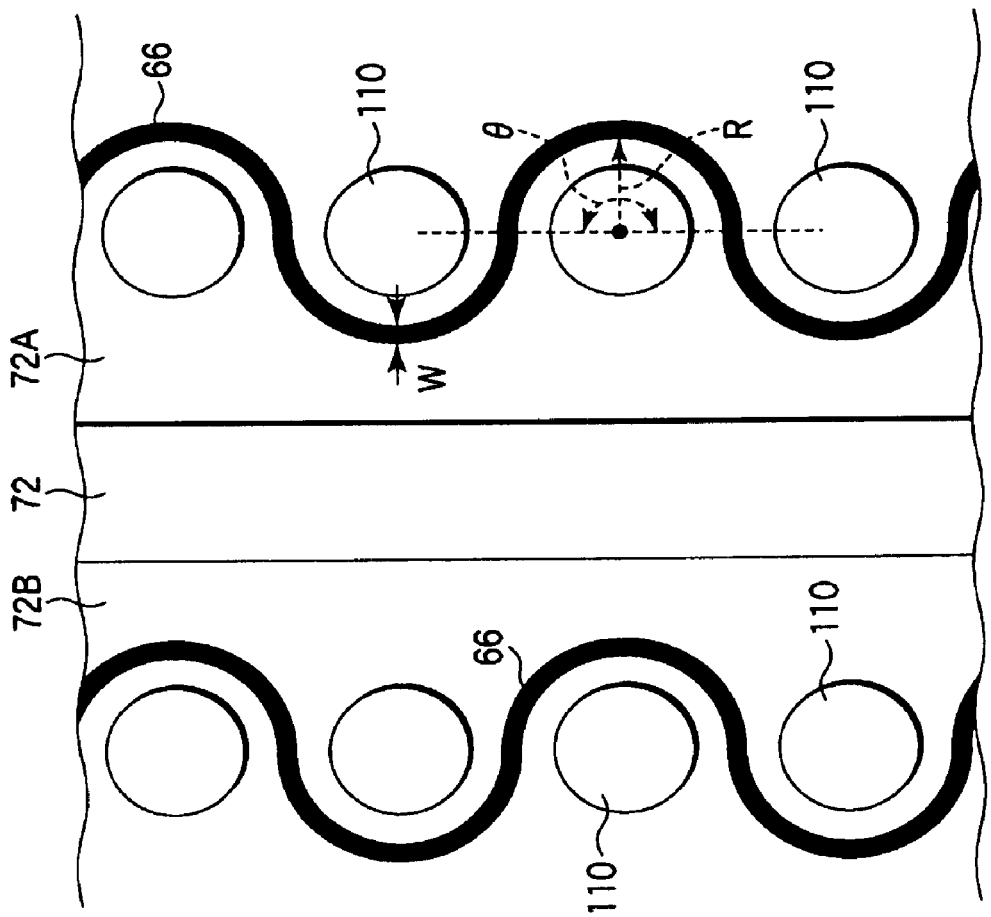
FIGS. 10A and 10B are schematic views showing a main part of an apparatus according to a first modified embodiment of the present invention.
Figure 10A:
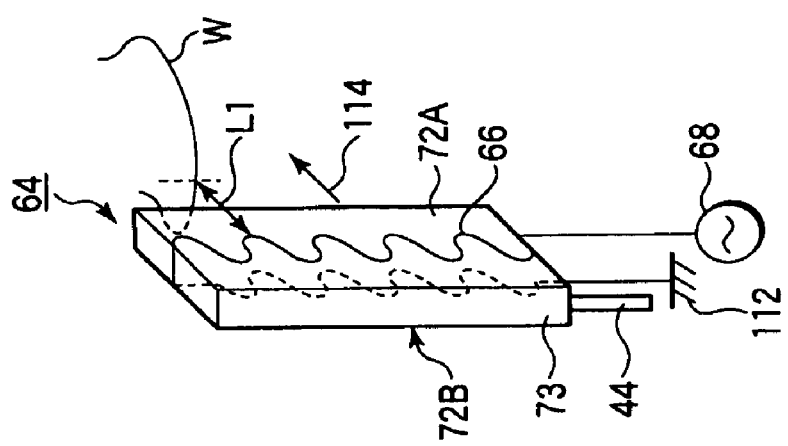

FIGS. 10A and 10B are schematic views showing a main part of an apparatus according to a first modified embodiment of the present invention, which includes a meandering electrode. FIG. 10A is a perspective view of a plasma generation box 64, FIG. 10B is an enlarged development view showing part of the plasma generation box 64 in a state where the opposite sidewalls are developed with respect to the backside wall used as the center.

The plasma generation box 64 is provided with an electrode 66 curved at a plurality of positions to form a meandering shape. Specifically, the electrode 66 extends along opposite sidewalls 72A and 72B in the longitudinal direction thereof while it is meandering with circular arcs that face alternately opposite sides to form a meandering shape. With this arrangement, the length of the electrode 66 set up along the plasma generation box 64 is increased.

The circular arcs have a radius R of, e.g., about 5 to 50 mm and an angle θ of π/2 to 3π/2, such as semicircular angle, i.e., θ=π as in this example. The electrode 66 has a width W of about 2 to 10 mm, as in the first embodiment. The curved directions of the opposite portions of the meandering electrode 66 along the opposite sidewalls 72A and 72B are set to be reverse to each other. Accordingly, in the development view of FIG. 10B, the curved directions face the same directions.

When an RF electric current flows through the electrode 66, circular regions 110 (which are shown in FIG. 10B) inside the circular arcs of the electrode 66 bring about high density plasma areas because the electric field formed by the RF comes to have a higher intensity at the regions 110 and locally increases the plasma density. Since the regions 110 are distributed at predetermined intervals inside the plasma generation box 64, a larger plasma generation area is obtained as a whole, and the plasma density becomes more uniform. This modified embodiment can also exhibit the same effect as the first embodiment described above.

In this modified embodiment, the curved directions of the opposite portions of the meandering electrode 66 along the opposite sidewalls 72A and 72B may be set to be the same as each other. In FIG. 10A, the entire line between the RF power supply 68 (a matching circuit (not shown) is disposed immediately downstream therefrom) and the grounded portion 112 represents the electrode 66. This matter is common to all the modified embodiments described below. An arrow 114 indicates the gas flow direction, i.e., the direction toward the center of the wafers.

The distance L1 between the electrode 66 and the nearest portion of the wafers W is set to be 40 mm or more. This is conceived to prevent plasma generated inside the plasma generation box 64 from coming into direct contact with the wafers W, so as not to damage the wafers W by the plasma. This distance L1 is common to the first embodiment described above and all the modified embodiments described below.

Second to Fourth Modified Embodiments

Figure 11D:
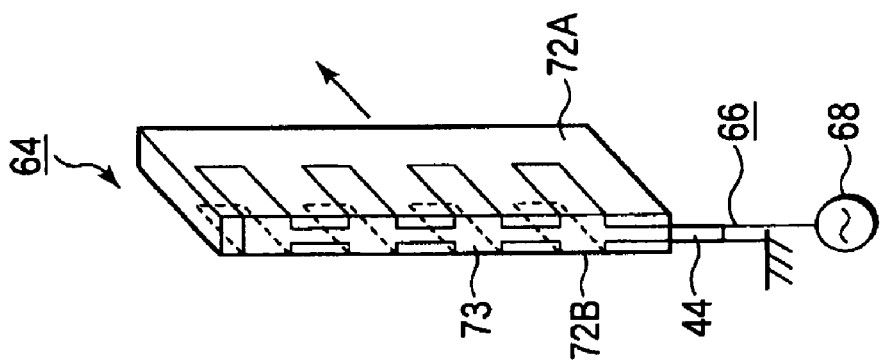
FIGS. 11A to 11D are schematic views showing main parts of apparatuses according to second to fourth modified embodiments of the present invention.
Figure 11C:
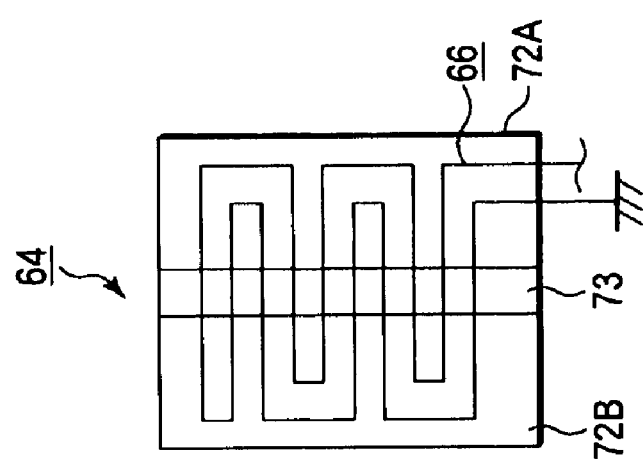
Figure 11B:
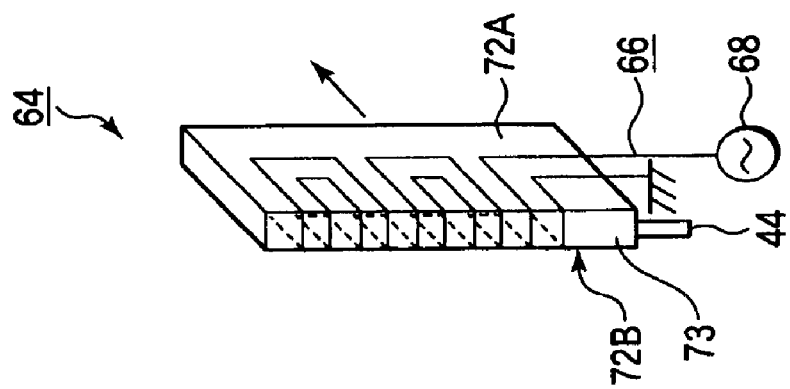
Figure 11A:
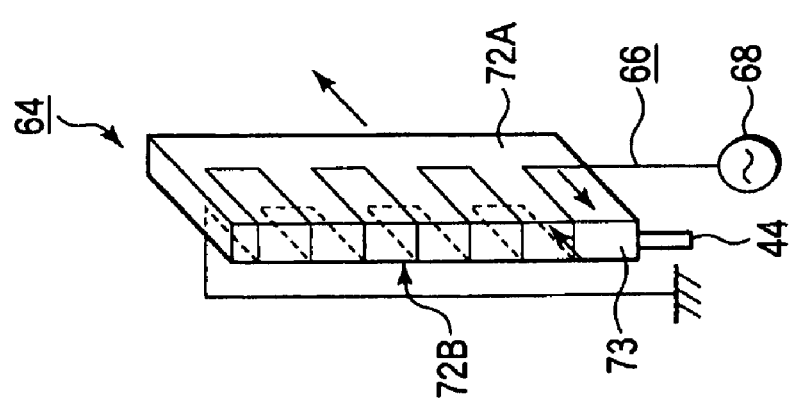

Next, an explanation will be given of second to fourth modified embodiments. FIGS. 11A to 11D are schematic views showing main parts of apparatuses according to the second to fourth modified embodiments, which also include a meandering electrode. FIG. 11A shows the second modified embodiment, FIG. 11B shows the third modified embodiment (FIG. 11C is a development view thereof), and FIG. 11D shows the fourth modified embodiment.

In the second modified embodiment shown in FIG. 11A, the plasma generation box 64 is provided with an electrode 66 curved at a plurality of positions to form a meandering shape. The electrode 66 forms the meandering shape by repeating the following figuration. Specifically, the electrode 66 extends from one of the opposite sidewalls 72A and 72B, such as the sidewall 72A, through the backside wall 73 to the other sidewall, such as the sidewall 72B. Then, the electrode 66 is curved along this latter sidewall 72B and is bent back from this sidewall 72B through the backside wall 73 to the former sidewall 72A. Then, the electrode 66 is curved along this former sidewall 72A and is bent back again from this sidewall 72A.

In this modified embodiment, FIG. 10A shows the meandering electrode 66 as being bent back at right angles. Alternatively, the meandering electrode 66 may be bent back with, e.g., circular arcs.

This modified embodiment can also exhibit the same effect as the first embodiment described above. Further, since the length of the electrode 66 set up along the plasma generation box 64 is increased, it is possible to increase the plasma density, to expand the plasma generation area, and to make the plasma density more uniform.

In the third modified embodiment shown in FIGS. 11B and 11C, the plasma generation box 64 is also provided with an electrode 66 curved at a plurality of positions to form a meandering shape. The electrode 66 forms the meandering shape by repeating the following figuration. Specifically, the electrode 66 extends from one of the opposite sidewalls 72A and 72B, such as the sidewall 72A, through the backside wall 73 to the other sidewall, such as the sidewall 72B. Then, the electrode 66 is curved with a smaller fold width along this latter sidewall 72B and is bent back from this sidewall 72B through the backside wall 73 to the former sidewall 72A. Then, the electrode 66 is curved with a larger fold width along this former sidewall 72A and is bent back again from this sidewall 72A. This figuration is performed from each of the opposite sidewalls 72A and 72B to the other. In other words, the electrode 66 is repeatedly bent back alternately with the smaller fold width and the larger fold width.

In this modified embodiment, FIGS. 10B and 10C show the meandering electrode 66 as being bent back at right angles. Alternatively, the meandering electrode 66 may be bent back with, e.g., circular arcs.

This modified embodiment can also exhibit the same effect as the first embodiment described above. Further, since the length of the electrode 66 set up along the plasma generation box 64 is increased, it is possible to increase the plasma density, to expand the plasma generation area, and to make the plasma density more uniform.

In the fourth modified embodiment shown in FIG. 11D, the plasma generation box 64 is also provided with an electrode 66 curved at a plurality of positions to form a meandering shape. The electrode 66 forms the meandering shape by repeating the following figuration. Specifically, the electrode 66 extends from one end of the backside wall 73 to one of the opposite sidewalls 72A and 72B, such as the sidewall 72A, and is curved along this former sidewall 72A and is bent back to the backside wall 73. Then, the electrode 66 is curved along the backside wall 73 and is bent back again to the former sidewall 72A. This figuration is repeated up to the other end of the backside wall 73. Then, the electrode 66 extends from the other end of the backside wall 73 to the other sidewall 72B, and is curved along this latter sidewall 72B and is bent back to the backside wall 73. Then, the electrode 66 is curved along the backside wall 73 and is bent back again to the latter sidewall 72B. This figuration is repeated down to the first one end of the backside wall 73. In other words, the electrode 66 first forms a meandering shape along one of the opposite sidewalls 72A and 72B (partly including the backside wall), and then forms a meandering shape along the other sidewall.

In this modified embodiment, FIG. 10D shows the meandering electrode 66 as being bent back at right angles. Alternatively, the meandering electrode 66 may be bent back with, e.g., circular arcs.

This modified embodiment can also exhibit the same effect as the first embodiment described above. Further, since the length of the electrode 66 set up along the plasma generation box 64 is increased, it is possible to increase the plasma density, to expand the plasma generation area, and to make the plasma density more uniform.

Fifth to Seventh Modified Embodiments

Figure 12A:
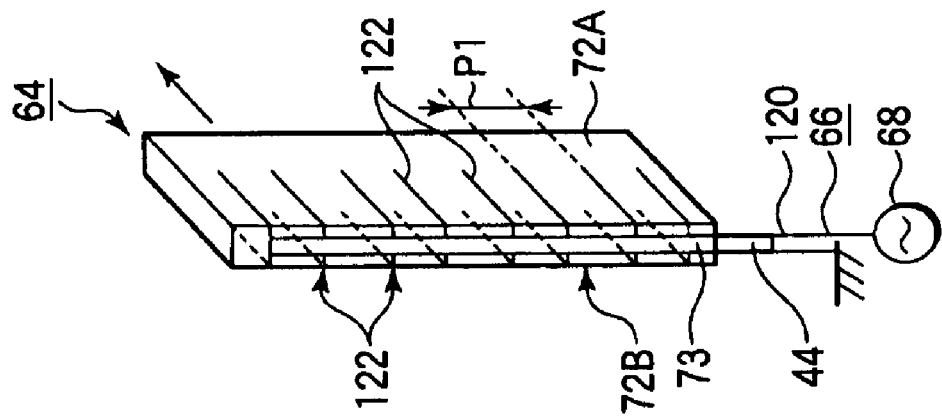
FIGS. 12A to 12C are schematic views showing main parts of apparatuses according to fifth to seventh modified embodiments of the present invention.
Figure 12B:
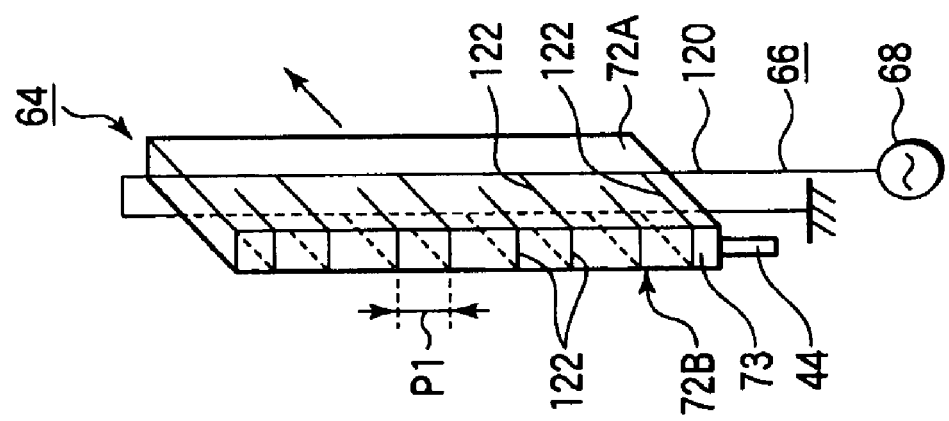
Figure 12C:
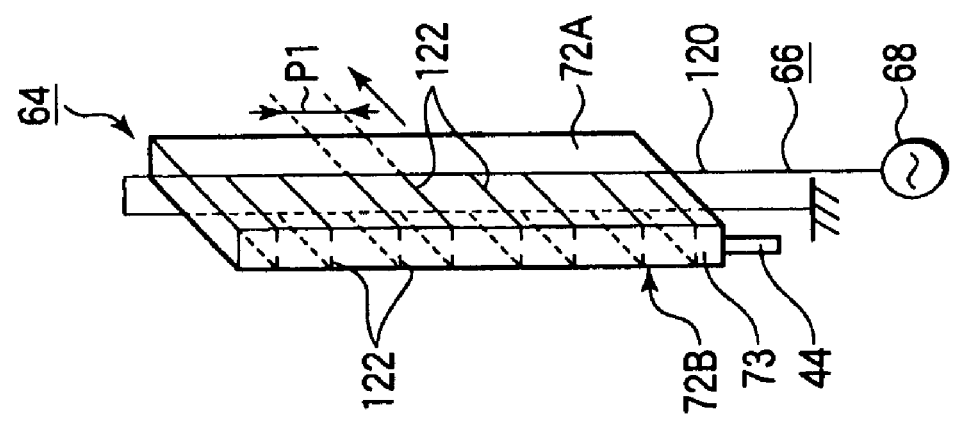

Next, an explanation will be given of fifth to seventh modified embodiments. These modified embodiments include a so-called centipede electrode. FIGS. 12A to 12C are schematic views showing main parts of apparatuses according to the fifth to seventh modified embodiments. FIG. 12A shows the fifth modified embodiment, FIG. 12B shows the sixth modified embodiment, and FIG. 12C shows the seventh modified embodiment.

In the fifth modified embodiment shown in FIG. 12A, the electrode 66 includes a main electrode 120 making one turn around the sidewalls 72A and 72B in the longitudinal direction thereof and a plurality of branch electrodes 122 branching from the main electrode 120 along the opposite sidewalls 72A and 72B and extending toward the backside wall 73. Specifically, the branch electrodes 122 along the opposite sidewalls 72A and 72B face each other through the opposite sidewalls 72A and 72B and extend to the backside wall 73 at their distal ends. The plasma density distribution can be controlled by suitably selecting the pitch P1 of the branch electrodes 122.

This modified embodiment can also exhibit the same effect as the first embodiment described above. Further, since the length of the electrode 66 set up along the plasma generation box 64 is increased, it is possible to increase the plasma density, to expand the plasma generation area, and to make the plasma density more uniform.

In the sixth modified embodiment shown in FIG. 12B, the electrode 66 also includes a main electrode 120 making one turn around the sidewalls 72A and 72B in the longitudinal direction thereof and a plurality of branch electrodes 122 branching from the main electrode 120 along the opposite sidewalls 72A and 72B and extending toward the backside wall 73. Specifically, the branch electrodes 122 from one of the sidewalls and the branch electrodes 122 from the other of the sidewalls are alternately arrayed. The branch electrodes 122 extend from each of the sidewalls through the backside wall 73 to the other of the sidewalls at their distal ends. The plasma density distribution can be controlled by suitably selecting the pitch P1 of the branch electrodes 122.

This modified embodiment can also exhibit the same effect as the first embodiment described above. Further, since the length of the electrode 66 set up along the plasma generation box 64 is increased, it is possible to increase the plasma density, to expand the plasma generation area, and to make the plasma density more uniform.

In the seventh modified embodiment shown in FIG. 12C, the electrode 66 includes a main electrode 120 making one turn along the backside wall 73 in the longitudinal direction thereof and a plurality of branch electrodes 122 branching from the main electrode 120 along the backside wall 73 and extending to the opposite sidewalls 72A and 72B. The plasma density distribution can be controlled by suitably selecting the pitch P1 of the branch electrodes 122.

This modified embodiment can also exhibit the same effect as the first embodiment described above. Further, since the length of the electrode 66 set up along the plasma generation box 64 is increased, it is possible to increase the plasma density, to expand the plasma generation area, and to make the plasma density more uniform.

Eighth and Ninth Modified Embodiments

Next, an explanation will be given of eighth and ninth modified embodiments. FIGS. 13A and 13B are schematic views showing main parts of apparatuses according to the eighth and ninth modified embodiments, which include a chain-like electrode. FIG. 13A shows the eighth modified embodiment, and FIG. 13B shows the ninth modified embodiment.

In the eighth modified embodiment shown in FIG. 13A, the electrode 66 includes a plurality of partly opened ring electrodes 124 connected in series. Specifically, the electrode 66 includes a plurality of ring electrodes 124 and connector electrodes 126 that connect the ring electrodes 124 to each other. The electrodes 124 each having a partly opened ring shape are arrayed along the opposite sidewalls 72A and 72B on a straight line in the longitudinal direction thereof. The connector electrodes 126 are disposed separately from the sidewalls and connect the ends of the ring electrodes 124 adjacent to each other in the array direction, so that the ring electrodes 124 are connected in series as a whole.

More specifically, each of the ring electrodes 124 is formed of a circular ring, part of which is cut out, and is disposed to the sidewall 72A or 72B. The opposite ends of each of the ring electrodes 124 extend outward from the sidewall 72A or 72B. For example, one of the ends is connected to an end of adjacent one of the ring electrodes 124 disposed therebelow by one of the connector electrodes 126, and the other ends is connected to an end of adjacent one of the ring electrodes 124 disposed thereabove by another one of the connector electrodes 126. Consequently, they are connected to each other to form a chain-like shape as a whole. The diameter of the ring electrodes 124 is not limited to a specific one, but may be about 10 to 65 mm, for example.

This modified embodiment can also exhibit the same effect as the first embodiment described above. Further, since the length of the electrode 66 set up along the plasma generation box 64 is increased, it is possible to increase the plasma density, to expand the plasma generation area, and to make the plasma density more uniform.

In the ninth modified embodiment shown in FIG. 13B, the electrode 66 also includes a plurality of partly opened ring electrodes 124 connected in series. Specifically, the electrode 66 includes a plurality of ring electrodes 124 and connector electrodes 126 that connect the ring electrodes 124 to each other. The electrodes 124 each having a partly opened ring shape are arrayed along the backside wall 73 in the longitudinal direction thereof. The connector electrodes 126 are disposed separately from the backside wall 73 and connect the ends of the ring electrodes 124 adjacent to each other in the array direction, so that the ring electrodes 124 are connected in series as a whole.

In this modified embodiment, the chain-like electrode 66 is disposed along the backside wall 73 in place of the opposite sidewalls 72A and 72B. In this case, the electrode 66 includes an electrode portion that extends downward from the upper end of the plasma generation box 64 to the grounded portion. This electrode portion may be separated from the opposite sidewalls 72A and 72B or disposed along one of the sidewalls.

This modified embodiment can also exhibit the same effect as the first embodiment described above. Further, since the length of the electrode 66 set up along the plasma generation box 64 is increased, it is possible to increase the plasma density, to expand the plasma generation area, and to make the plasma density more uniform.

Tenth and Eleventh Modified Embodiments

Next, an explanation will be given of tenth and eleventh modified embodiments. FIGS. 14A and 14B are schematic views showing main parts of apparatuses according to the tenth and eleventh modified embodiments, which include an electrode of a double-round type. FIG. 14A shows the tenth modified embodiment, and FIG. 14B shows the eleventh modified embodiment.

In the tenth modified embodiment shown in FIG. 14A, the electrode 66 makes two rounds in the longitudinal direction of the opposite sidewalls 72A and 72B. In this case, the electrode 66 is wound twice to make two rounds (two turns) around the opposite sidewalls 72A and 728 in the longitudinal direction thereof.

Specifically, the electrode 66 is wound from one sidewall 72A to the other sidewall 72B twice in the longitudinal direction thereof. The electrode portion of the first turn and the electrode portion of the second turn are not overlapped with each other but are separated from each other by a predetermined distance L2 of e.g., about 10 to 40 mm.

This modified embodiment can also exhibit the same effect as the first embodiment described above. Further, since the length of the electrode 66 set up along the plasma generation box 64 is increased, it is possible to increase the plasma density, to expand the plasma generation area, and to make the plasma density more uniform.

In the eleventh modified embodiment shown in FIG. 14B, the electrode 66 also makes two rounds in the longitudinal direction of the opposite sidewalls 72A and 72B. In this case, the electrode 66 makes one round along one of the opposite sidewalls 72A and 72B, such as the sidewall 72A, in the longitudinal direction thereof, while electrode portions are separated from each other. Then, the electrode 66 makes one round along the other sidewalls, such as the sidewall 72B, in the longitudinal direction thereof, while electrode portions are separated from each other.

As described above, the electrode 66 first makes one round along one sidewall 72A, and then makes one round along the other sidewall 72B. The electrode portions of the one round are separated by a distance L3 of, e.g., about 10 to 40 mm, as in L2 shown in FIG. 14A.

This modified embodiment can also exhibit the same effect as the first embodiment described above. Further, since the length of the electrode 66 set up along the plasma generation box 64 is increased, it is possible to increase the plasma density, to expand the plasma generation area, and to make the plasma density more uniform.

Twelfth to Fourteenth Modified Embodiments

Figure 15C:
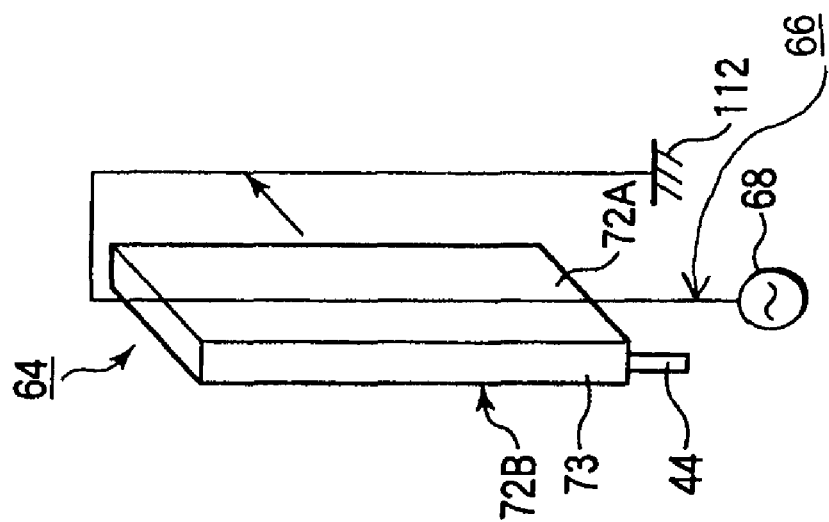
FIGS. 15A to 15C are schematic views showing main parts of apparatuses according to twelfth to fourteenth modified embodiments of the present invention.
Figure 15B:
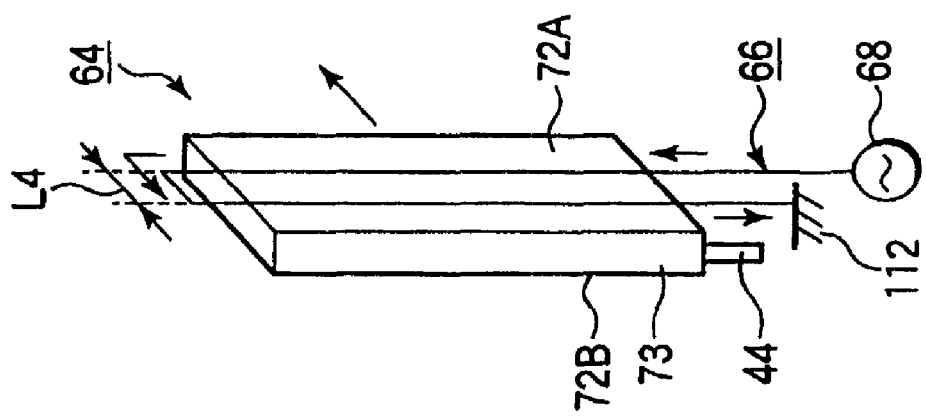
Figure 15A:
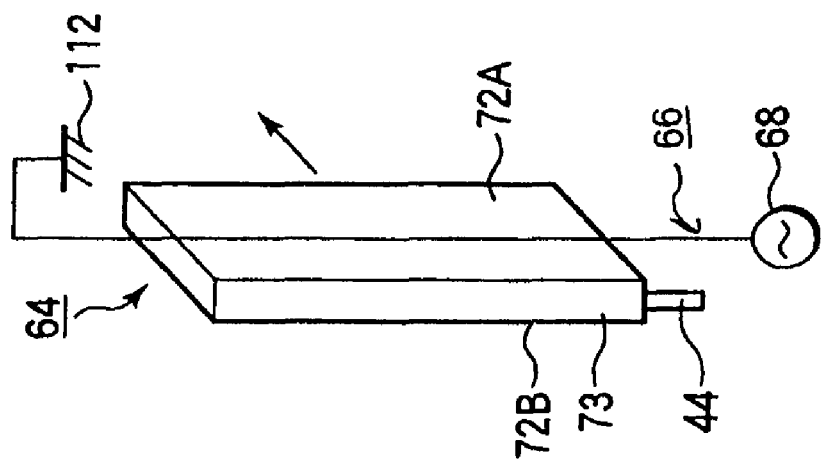

Next, an explanation will be given of twelfth to fourteenth modified embodiments. FIGS. 15A to 15C are schematic views showing main parts of apparatuses according to the twelfth to fourteenth modified embodiments, which include an electrode disposed along only one of the sidewalls. FIG. 15A shows the twelfth modified embodiment, FIG. 15B shows the thirteenth modified embodiment, and FIG. 15C shows the fourteenth modified embodiment.

In the twelfth modified embodiment shown in FIG. 15A, the electrode 66 is disposed along only one of the opposite sidewalls 72A and 72B. Specifically, the electrode 66 makes a half turn along one of the opposite sidewalls 72A and 72B, such as the sidewall 72A, in the longitudinal direction thereof. The electrode 66 is connected to an RF power supply 68 at the lower end and grounded at the upper end.

In this case, since the electrode 66 makes a half turn in place of one turn, this electrode 66 is slightly less effective as compared to the one turn electrode. However, this modified embodiment can also exhibit an effect of the same kind as the first embodiment shown in FIG. 3.

Further, the grounded portion 112 is positioned at the upper end of the electrode 66 to shorten the entire length of the electrode 66. In this case, the electric field distribution formed along the longitudinal direction of the electrode 66 becomes uniform and the plasma density is thereby improved. The electrode 66 may be connected to an RF power supply 68 at the upper end and grounded at the lower end.

In the thirteenth modified embodiment shown in FIG. 15B, the electrode 66 is also disposed along only one of the opposite sidewalls 72A and 72B. Specifically, the electrode 66 makes one round along one of the opposite sidewalls 72A and 72B, such as the sidewall 72B, in the longitudinal direction thereof. In this case, the portions of the one round electrode 66 are separated by a distance L4 of, e.g., about 10 to 40 mm.

This modified embodiment can also exhibit an effect of the same kind as the first embodiment described above. Further, since the length of the electrode 66 set up along the plasma generation box 64 is increased, it is possible to increase the plasma density, to expand the plasma generation area, and to make the plasma density more uniform.

Further, since the material of the sidewalls 72A and 72B of the plasma generation box 64, i.e., quartz is not present between the portions of the one round electrode 66, the capacitive coupling is weakened while the inductive coupling is enhanced.

In the fourteenth modified embodiment shown in FIG. 15C, the electrode 66 is also disposed along only one of the opposite sidewalls 72A and 72B. Specifically, the electrode 66 makes a half turn along one of the opposite sidewalls 72A and 72B, such as the sidewall 72A, in the longitudinal direction thereof. The electrode 66 is connected to an RF power supply 68 at the lower end, and is bent back at the other end downward to be separate from the sidewall 72A and grounded. This modified embodiment is the same as the twelfth modified embodiment shown in FIG. 15A, except that the grounded portion 112 is present on a lower side, and thus exhibit the same effect as the twelfth modified embodiment.

Fifteenth to Seventeenth Modified Embodiments

Figure 16C:
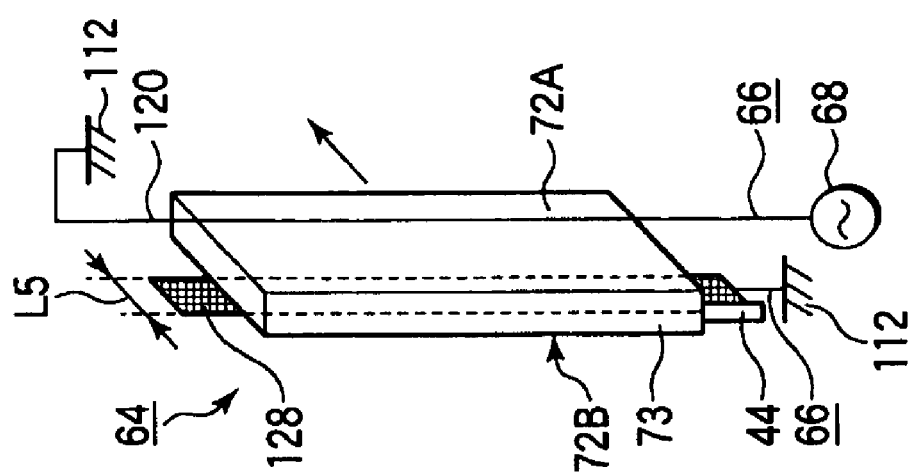
FIGS. 16A to 16C are schematic views showing main parts of apparatuses according to fifteenth to seventeenth modified embodiments of the present invention.
Figure 16B:
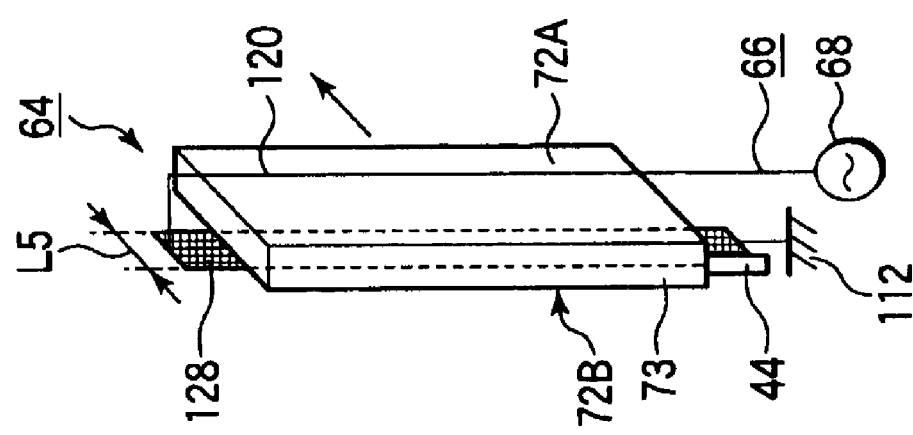
Figure 16A:
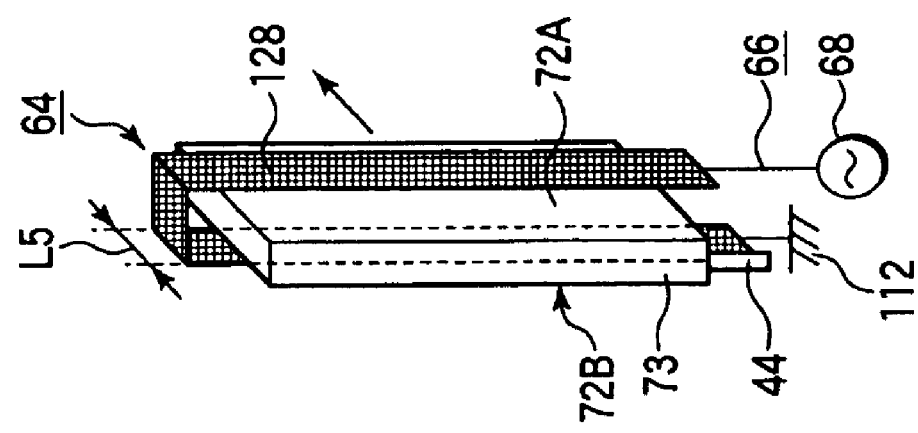

Next, an explanation will be given of fifteenth to seventeenth modified embodiments. FIGS. 16A to 16C are schematic views showing main parts of apparatuses according to the fifteenth to seventeenth modified embodiments, which include a wide plate-like electrode (belt-shaped electrode). FIG. 16A shows the fifteenth modified embodiment, FIG. 16B shows the sixteenth modified embodiment, and FIG. 16C shows the seventeenth modified embodiment.

In the fifteenth modified embodiment shown in FIG. 16A, the electrode 66 comprises a wide electrode 128 having a predetermined width L5. Specifically, the wide electrode 128 is disposed to make one turn around the opposite sidewalls 72A and 72B in the longitudinal direction thereof.

This wide electrode 128 has a width far larger than the electrode 66 of the first modified embodiment shown in FIG. 3. For example, this width L5 is set to be 5 to 40 mm. The width L5 of the wide electrode 128 is preferably set to be 20% or more of the width of the plasma generation box 64, so that the plasma generation area becomes larger as far as possible. Specifically, the wide electrode 128 is formed of a metal plate, metal punching plate, or metal mesh.

This modified embodiment can also exhibit the same effect as the first embodiment described above. Further, since the length of the electrode 66 set up along the plasma generation box 64 is increased, it is possible to increase the plasma density, to expand the plasma generation area, and to make the plasma density more uniform.

In the sixteenth modified embodiment shown in FIG. 16B, the electrode 66 also comprises a wide electrode 128 having a predetermined width L5. Specifically, the electrode 66 includes a main electrode 120 extending along one of the opposite sidewalls 72A and 72B, such as the sidewall 72A, in the longitudinal direction thereof and the wide electrode 128 extending along the other sidewall 72B in the longitudinal direction thereof. The main electrode 120 and wide electrode 128 are connected to each other at the top. The wide electrode 128 is grounded at the lower end.

The material and the width of the wide electrode 128 are the same as those shown in FIG. 16A. In this modified embodiment, since the width of the electrode along the sidewall 72A is smaller than that shown in FIG. 16A, the plasma generation area becomes smaller. However, this modified embodiment can also exhibit an effect of the same kind as the modified embodiment shown in FIG. 16A.

In the seventeenth modified embodiment shown in FIG. 16C, the electrode 66 also comprises a wide electrode 128 having a predetermined width L5. Specifically, the electrode 66 includes a main electrode 120 extending along one of the opposite sidewalls 72A and 72B, such as the sidewall 72A, in the longitudinal direction thereof and the wide electrode 128 for grounding which extends along the other sidewall 72B in the longitudinal direction thereof. The main electrode 120 and wide electrode 128 for grounding are electrically separated from each other.

The main electrode 120 is grounded at the upper end, as in FIG. 15A. The material and the width of the wide electrode 128 for grounding are the same as those shown in FIG. 16B.

In this case, since the electrode 120 and wide electrode 128 for grounding are electrically separated from each other, the inductive coupling is weakened. However, this modified embodiment can also exhibit an effect of the same kind as the modified embodiment shown in FIG. 16B.

Eighteenth to Twenty-Fourth Modified Embodiments

Figure 18C:
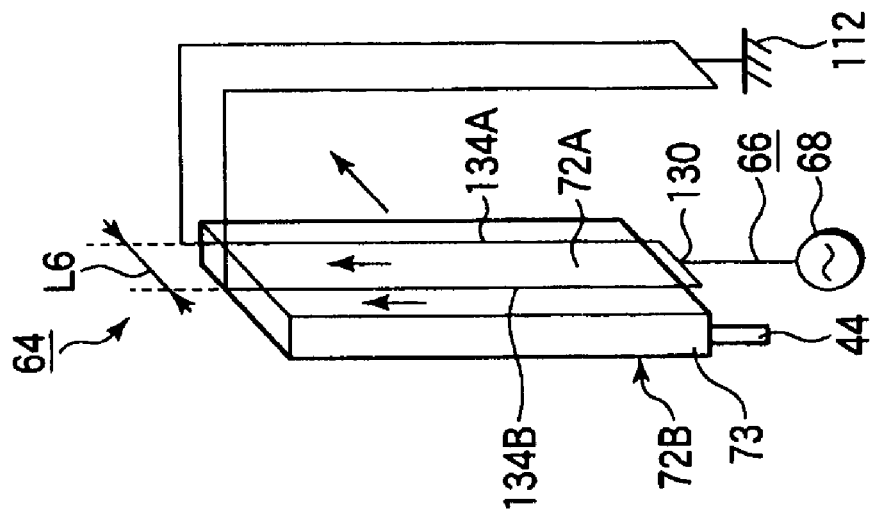
FIGS. 18A to 18C are schematic views showing main parts of apparatuses according to twenty-second to twenty-fourth modified embodiments of the present invention.
Figure 18B:
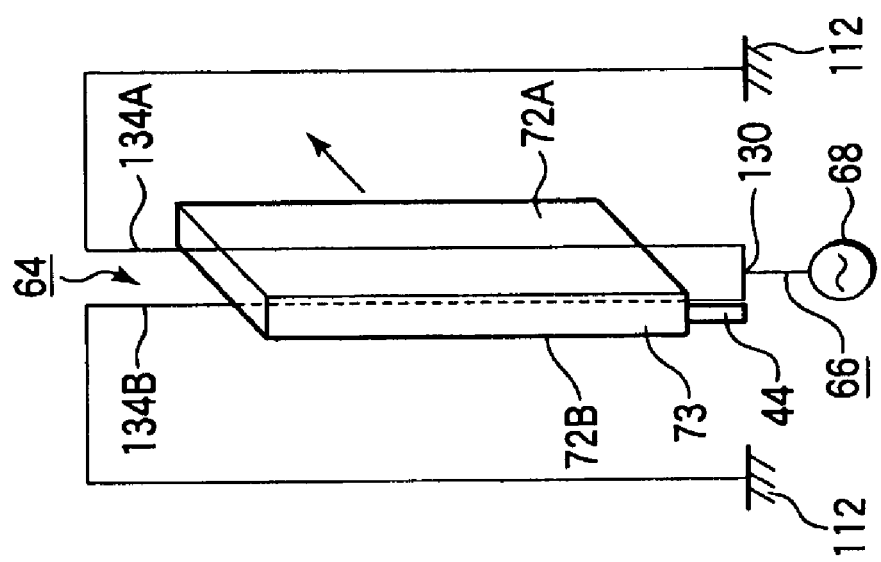
Figure 18A:
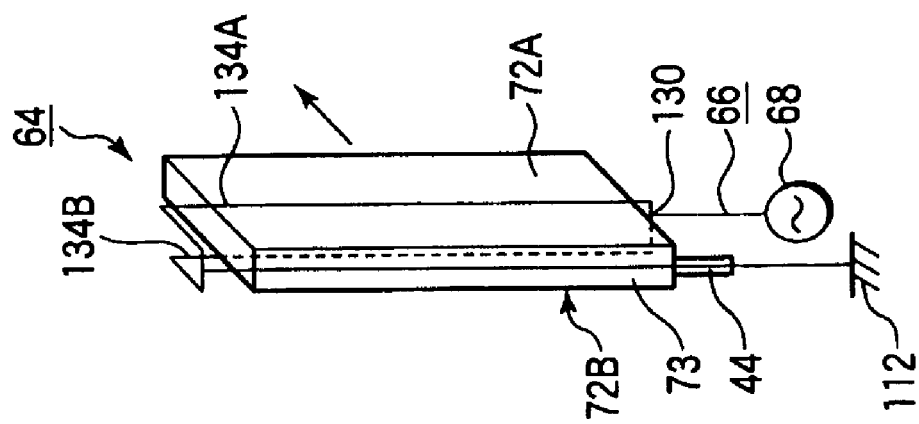

Next, an explanation will be given of eighteenth to twenty-fourth modified embodiments. FIGS. 17A to 17D are schematic views showing main parts of apparatuses according to the eighteenth to twenty-first modified embodiments. FIGS. 18A to 18C are schematic views showing main parts of apparatuses according to the twenty-second to twenty-fourth modified embodiments. These modified embodiments include an electrode with branch electrodes branching along the path. FIG. 17A shows the eighteenth modified embodiment, FIG. 17B shows the nineteenth modified embodiment, FIG. 17C shows the twentieth modified embodiment, and FIG. 17D shows the twenty-first modified embodiment. FIG. 18A shows the twenty-second modified embodiment, FIG. 18B shows the twenty-third modified embodiment, and FIG. 18C shows the twenty-fourth modified embodiment.

In the eighteenth modified embodiment shown in FIG. 17A, the electrode 66 includes a diverging node 130 along the path from which two main branch electrodes diverge. Specifically, the electrode 66 is connected to an RF power supply 68 at the center in the longitudinal direction of one of the opposite sidewalls 72A and 72B, such as the sidewall 72A. The electrode 66 includes the diverging node 130 at this center from which it is divided into a main branch electrode 134A extending upward and a main branch electrode 134B extending downward. The main branch electrodes 134A and 134B are bent back toward the other sidewall 72B and are connected to each other at the center in the longitudinal direction of the sidewall 728.

More specifically, one main branch electrode 134A is bent back toward the other sidewall 72B at the top of the plasma generation box 64. The other main branch electrode 134B is bent back toward the other sidewall 72B at the bottom of the plasma generation box 64. Then, the main branch electrodes 134A and 134B extend along the sidewall 72B in the longitudinal direction thereof, and are connected to each other at the center of the plasma generation box 64 in the vertical direction, at which they are grounded.

This modified embodiment can also exhibit the same effect as the first embodiment shown in FIGS. 2 and 3. Further, particularly, since the length between the RF power supply 68 and grounded portion 122 is very short, the voltage change of the main branch electrodes 134A and 134B in the longitudinal direction is very small. Consequently, the plasma density inside the plasma generation box 64 becomes more uniform in the vertical (longitudinal) direction.

In the nineteenth modified embodiment shown in FIG. 17B, the electrode 66 also includes a diverging node 130 along the path from which two main branch electrodes diverge. Specifically, the electrode 66 is connected to an RF power supply 68 at the bottom of the plasma generation box 64, and is divided into two main branch electrodes 134A and 134B from the diverging node 130 at the bottom. The main branch electrodes 134A and 134B extend along one of the sidewalls, such as the sidewall 72A, in the longitudinal direction thereof, and are bent back at the top of the plasma generation box 64. Then, the main branch electrodes extend along the other sidewall 72B in the longitudinal direction thereof, and are grounded at the lower end. In other words, the two main branch electrodes 134A and 134B respectively make one turns, while using the RF power supply 68 in common.

This modified embodiment can also exhibit the same effect as the first embodiment described above. Further, since the length of the electrode 66 set up along the plasma generation box 64 is increased, it is possible to increase the plasma density, to expand the plasma generation area, and to make the plasma density more uniform.

In the twentieth modified embodiment shown in FIG. 17C, the electrode 66 also includes a diverging node 130 along the path from which two main branch electrodes diverge. Specifically, the electrode 66 is connected to an RF power supply 68 at the bottom of the plasma generation box 64, and is divided into two main branch electrodes 134A and 134B from the diverging node 130 at the bottom. The main branch electrodes 134A and 134B extend along one of the sidewalls, such as the sidewall 72A, in the longitudinal direction thereof, and are bent back at the top of the plasma generation box 64. Then, the main branch electrodes are joined into one electrode at the top, which extends along the other sidewall 72B in the longitudinal direction thereof, and is grounded at the lower end.

In other words, this modified embodiment is altered from the modified embodiment shown in FIG. 17B, such that the main branch electrodes 134A and 134B are joined into one electrode at the top of the plasma generation box 64. However, this modified embodiment can also exhibit an effect of the same kind as the modified embodiment shown in FIG. 17B.

In the twenty-first modified embodiment shown in FIG. 17D, the electrode 66 also includes a diverging node 130 along the path from which two main branch electrodes diverge. Specifically, the electrode 66 is connected to an RF power supply 68 at the bottom of the plasma generation box 64, and is divided into two main branch electrodes 134A and 134B from the diverging node 130 at the bottom. The two main branch electrodes 134A and 1348 respectively extend along the respective sidewalls 72A and 72B in the longitudinal direction thereof, and are respectively bent back toward the opposite sides at the top of the plasma generation box 64. Then, the two main branch electrodes 134A and 134B respectively extend along the respective sidewalls 72A and 72B in the longitudinal direction thereof, and are grounded at the lower end.

In other words, one main branch electrode 134A extends along one sidewall 72A, turns back at the top to the opposite side, and extends along the other sidewall 72B to form a one turn electrode. The other main branch electrode 134B extends along the other sidewall 72B, turns back at the top to the opposite side, and extends along the sidewall 72A to form a one turn electrode. The main branch electrodes 134A and 134B are joined and grounded at the lower end.

Consequently, the electrode makes two turns as a whole. This modified embodiment can also exhibit the same effect as the first embodiment described above. Further, since the length of the electrode 66 set up along the plasma generation box 64 is increased, it is possible to increase the plasma density, to expand the plasma generation area, and to make the plasma density more uniform.

In the twenty-second modified embodiment shown in FIG. 18A, the electrode 66 also includes a diverging node 130 along the path from which two main branch electrodes diverge. Specifically, the electrode 66 is connected to an RF power supply 68 at the bottom of the plasma generation box 64, and is divided into two main branch electrodes 134A and 134B from the diverging node 130 at the bottom. The two main branch electrodes 134A and 134B respectively extend along the respective sidewalls 72A and 72B in the longitudinal direction thereof, and are bent back at the top of the plasma generation box 64. Then, the main branch electrodes are joined into one electrode at the top, which extends along the backside wall 73 in the longitudinal direction thereof, and is grounded at the lower end.

In other words, the electrode 66 makes one turn around the sidewalls 72A and 72B, and makes a half turn along the backside wall 73. This modified embodiment can also exhibit the same effect as the first embodiment described above. Further, since the length of the electrode 66 set up along the plasma generation box 64 is increased, it is possible to increase the plasma density, to expand the plasma generation area, and to make the plasma density more uniform.

In the twenty-third modified embodiment shown in FIG. 18B, the electrode 66 also includes a diverging node 130 along the path from which two main branch electrodes diverge. Specifically, the electrode 66 is connected to an RF power supply 68 at the bottom of the plasma generation box 64, and is divided into two main branch electrodes 134A and 134B from the diverging node 130 at the bottom. The two main branch electrodes 134A and 134B respectively extend along the respective sidewalls 72A and 72B in the longitudinal direction thereof, and are respectively grounded at the top of the plasma generation box 64 while they are separated from the sidewalls 72A and 72B.

As described above, the two main branch electrodes 134A and 1348 respectively extend along the respective sidewalls 72A and 72B in the longitudinal direction thereof. This modified embodiment can also exhibit the same effect as the first embodiment shown in FIG. 2. Further, since RF electric currents flow through the two main branch electrodes 134A and 134B in the same direction, the capacitive coupling between the two main branch electrodes 134A and 134B is weakened.

In the twenty-fourth modified embodiment shown in FIG. 18C, the electrode 66 also includes a diverging node 130 along the path from which two main branch electrodes diverge. Specifically, the electrode 66 is connected to an RF power supply 68 at the bottom of the plasma generation box 64, and is divided into two main branch electrodes 134A and 134B from the diverging node 130 at the bottom. The main branch electrodes 134A and 134B extend along one of the sidewalls, such as the sidewall 72A, in the longitudinal direction thereof, while they are separated from each other by a predetermined distance L6. The main branch electrodes 134A and 134B are bent back outward at the top of the sidewall 72A to be separate from the sidewall 72A, and extend downward to the grounded portion.

As described above, the two main branch electrodes 134A and 134B extend along one of the sidewalls, such as the sidewall 72A, in the longitudinal direction thereof, in parallel with each other with the distance L6 therebetween. In this case, the distance L6 is set to be, e.g., about 10 to 40 mm.

This modified embodiment can also exhibit an effect of the same kind as the first embodiment described above. Further, since the length of the electrode 66 set up along the plasma generation box 64 is increased, it is possible to increase the plasma density, to expand the plasma generation area, and to make the plasma density more uniform. Further, as in the modified embodiment shown in FIG. 18B, the capacitive coupling between the two main branch electrodes 134A and 134B is weakened.

Twenty-Fifth Modified Embodiment

Figure 19:
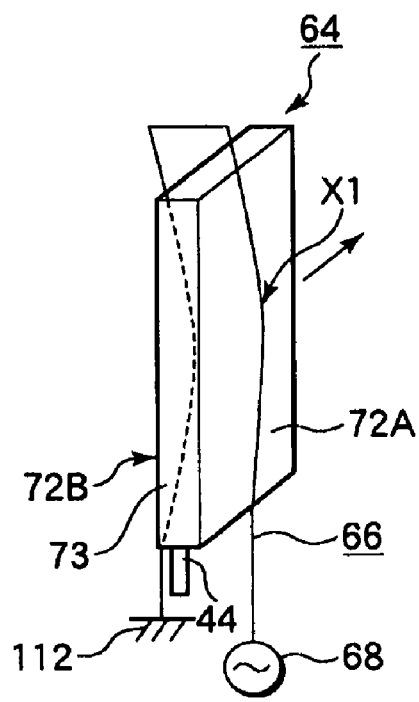
FIG. 19 is a schematic view showing a main part of an apparatus according to a twenty-fifth modified embodiment of the present invention.

Next, an explanation will be given of a twenty-fifth modified embodiment. FIG. 19 is a schematic view showing a main part of an apparatus according to the twenty-fifth modified embodiment. In the twenty-fifth modified embodiment, the electrode 66 makes one turn around the opposite sidewalls 72A and 72B, and has a curved shape. The electrode portions are curved to project most at a portion X1 corresponding to the center of the plasma generation box 64 in the vertical direction, toward the center of the process container 14 (see FIG. 2).

In other words, this one turn electrode 66 is curved with, e.g., a circular arc such that the central portion X1 of the electrode 66 in the longitudinal direction is closest to the wafers W and the upper and lower sides of the electrode 66 are farthest from the wafers W.

This modified embodiment can also exhibit the same effect as the first embodiment shown in FIGS. 2 and 3. When plasma is generated inside the plasma generation box 64, the plasma density tends to be higher near the top and bottom inside the box 64, from which plasma may reach wafers and cause plasma damage. Where the upper and lower sides of the electrode 66 are set to be more distant from the wafers W, generated plasma is prevented from reaching the wafers, so that the possibility of the wafers suffering plasma damage can be lower. Further, plasma can be thereby uniformly generated in the vertical direction inside the plasma generation box 64.

Twenty-Sixth Modified Embodiment

Figure 20:
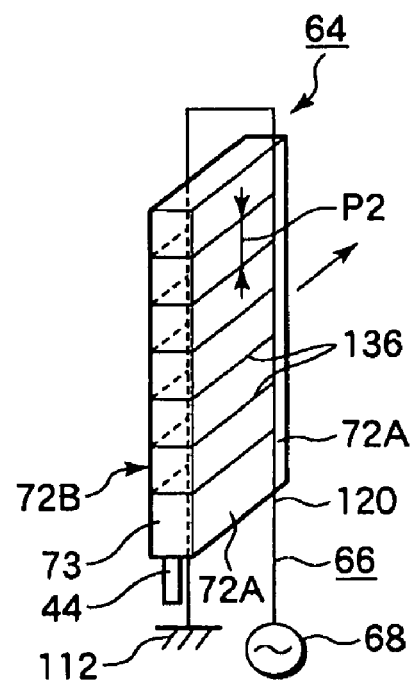
FIG. 20 is a schematic view showing a main part of an apparatus according to a twenty-sixth modified embodiment of the present invention.

Next, an explanation will be given of a twenty-sixth modified embodiment. FIG. 20 is a schematic view showing a main part of an apparatus according to the twenty-sixth modified embodiment. In the twenty-sixth modified embodiment, the electrode 66 includes a main electrode 120 making one turn around the opposite sidewalls 72A and 72B in the longitudinal direction thereof. A plurality of bypass electrodes 136 extend from the main electrode 120 in the width direction of the opposite sidewalls 72A and 72B through the backside wall 73, so as to connect the portions of the main electrode 66 along the opposite sidewalls 72A and 72B to each other.

This modified embodiment is similar to the modified embodiment shown in FIG. 12A or 12B. The plasma density inside the plasma generation box 64 can be controlled by suitably selecting the pitch P2 of the bypass electrodes 136.

This modified embodiment can also exhibit the same effect as the first embodiment described above. Further, since the length of the electrode 66 set up along the plasma generation box 64 is increased, it is possible to increase the plasma density, to expand the plasma generation area, and to make the plasma density more uniform.

Twenty-Seventh Modified Embodiment

Figure 21:
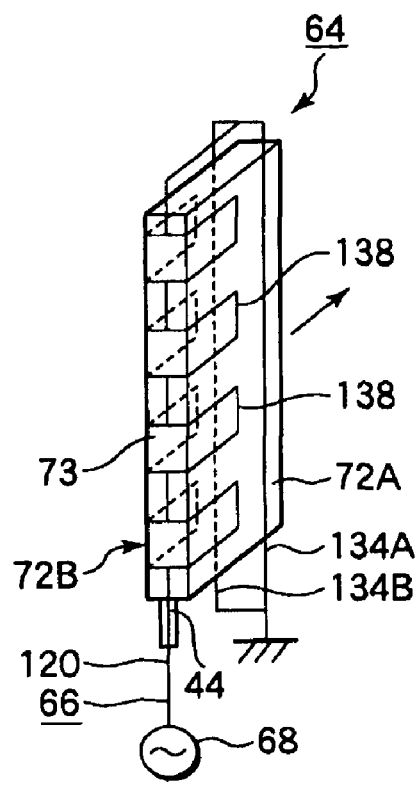
FIG. 21 is a schematic view showing a main part of an apparatus according to a twenty-seventh modified embodiment of the present invention.

Next, an explanation will be given of a twenty-seventh modified embodiment. FIG. 21 is a schematic view showing a main part of an apparatus according to the twenty-seventh modified embodiment. In the twenty-seventh modified embodiment, the electrode 66 includes a main electrode 120, which is connected to an RF power supply 68 at the bottom of the plasma generation box 64 and extends along the backside wall 73 in the longitudinal direction thereof. The main electrode 120 is connected to a plurality of loop electrodes 138 extending to the opposite sidewalls 72A and 72B to form loops. The electrode 66 further includes main branch electrodes 134A and 134B, which diverge at the top of the plasma generation box 64 and respectively extend along the respective sidewalls 72A and 72B in the longitudinal direction thereof to the grounded portion. This modified embodiment can exhibit an effect of the same kind as the twenty-sixth modified embodiment including a plurality of bypass electrodes 136 shown in FIG. 20.

Twenty-Eighth Modified Embodiment

Figure 22:
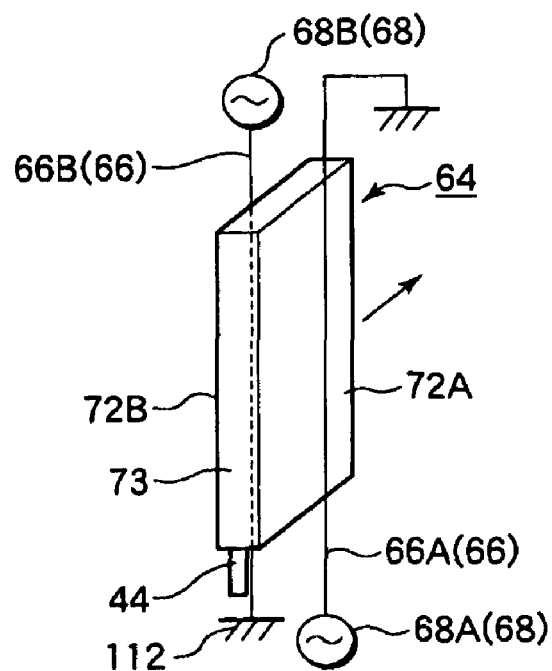
FIG. 22 is a schematic view showing a main part of an apparatus according to a twenty-eighth modified embodiment of the present invention.

Next, an explanation will be given of a twenty-eighth modified embodiment. FIG. 22 is a schematic view showing a main part of an apparatus according to the twenty-eighth modified embodiment. In the twenty-eighth modified embodiment, two RF power supplies 68 (68A and 68B) and two electrode 66 (66A and 66B) are used. One electrode 66A of the two electrodes 66A and 66B extends along one of the opposite sidewalls 72A and 72B, such as the sidewall 72A, in the longitudinal direction thereof. The lower end of the electrode 66A is connected to one of the two RF power supplies 68A and 68B, such as the RF power supply 68A, and the upper end thereof is grounded. The other electrode 66B extends along the other sidewall 72B in the longitudinal direction thereof. The upper end of the electrode 66B is connected to the other RF power supply 68B and the lower end thereof is grounded. In other words, the electrodes 66A and 66B respectively make half turns along the opposite sidewalls 72A and 72B, and are connected to the RF power supplies 68A and 68B respectively at opposite sides in the vertical direction, i.e., the lower and upper sides. This modified embodiment can exhibit an effect of the same kind as the first embodiment described above. Further, since the two RF power supplies 68A and 68B are used, an RF power with a higher power level can be applied.

Twenty-Ninth Modified Embodiment

Figure 23:
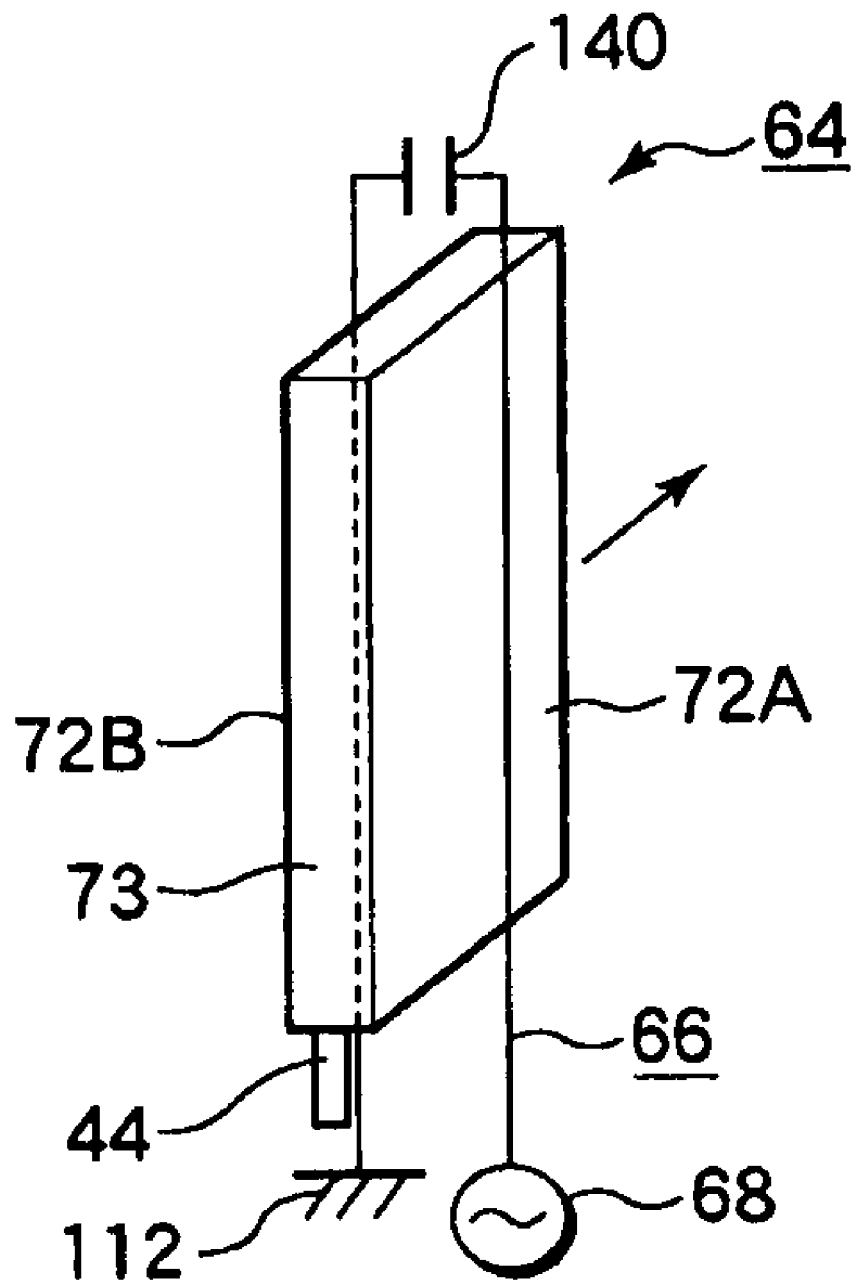
FIG. 23 is a schematic view showing a main part of an apparatus according to a twenty-ninth modified embodiment of the present invention.

Next, an explanation will be given of a twenty-ninth modified embodiment. FIG. 23 is a schematic view showing a main part of an apparatus according to the twenty-ninth modified embodiment. In the twenty-ninth modified embodiment, the electrode 66 is provided with a capacitor 140 along the path in the longitudinal direction. Specifically, the electrode 66 making one turn, as in the electrode 66 shown in FIGS. 2 and 3, is provided with the capacitor 140 at the bent back position of the electrode 66, i.e., at the midpoint of the electrode 66 in the longitudinal direction.

This modified embodiment can exhibit an effect of the same kind as the first embodiment shown in FIGS. 2 and 3. Further, since the electrode 66 is provided with the capacitor 140 along the path, the phase difference between the RF voltage and electric current can be adjusted to form a phase difference of 90 degrees between them. With this circuit arrangement, the capacitive coupling is weakened.

Providing an electrode with a capacitor 140 along the path may be applied to each of the main electrode 120, wide electrode 128, and main branch electrodes 134A and 134B in the first embodiment and first to twenty-eighth modified embodiments described above, such that the electrode is provided with a capacitor 140 near the midpoint of the electrode in the longitudinal direction.

Thirtieth to Thirty-Second Modified Embodiments

Figure 24A:
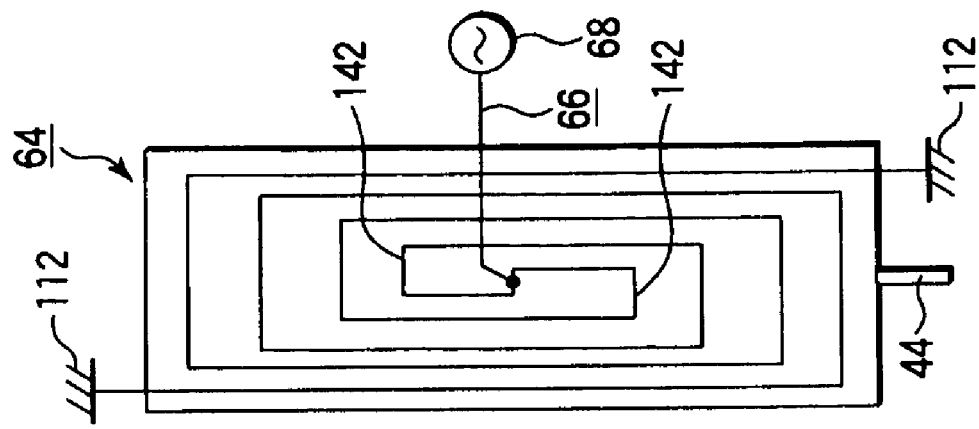
FIGS. 24A to 24C are schematic views showing main parts of apparatuses according to thirtieth to thirty-second modified embodiments of the present invention.
Figure 24B:
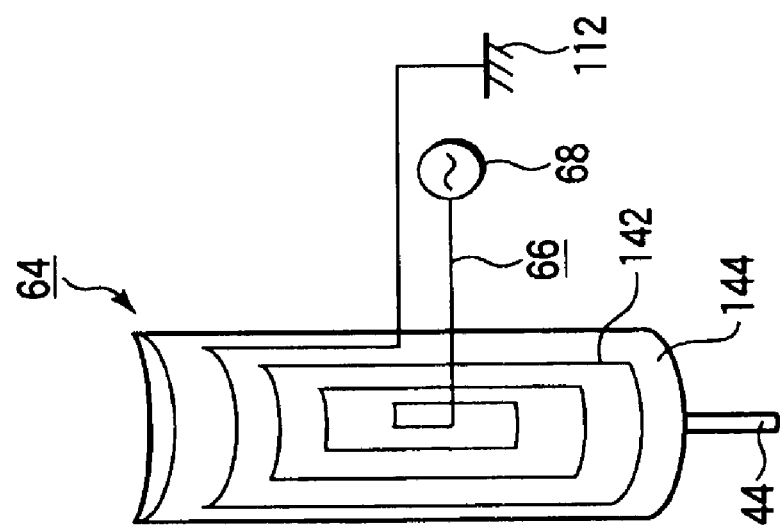
Figure 24C:
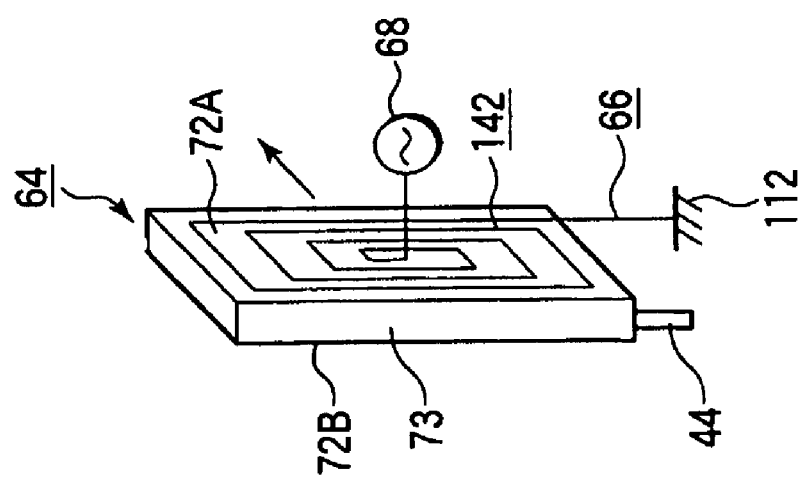

Next, an explanation will be given of thirtieth to thirty-second modified embodiments. FIGS. 24A to 24C are schematic views showing main parts of apparatuses according to the thirtieth to thirty-second modified embodiments, which include a spiral-type electrode forming a whorl pattern on one plane. FIG. 24A shows the thirtieth modified embodiment, FIG. 24B shows the thirty-first modified embodiment, and FIG. 24C shows the thirty-second modified embodiment.

In the thirtieth modified embodiment shown in FIG. 24A, the electrode 66 comprises a whorl electrode 142 forming a whorl pattern. Specifically, the whorl electrode 142 is disposed along one of the opposite sidewalls 72A and 72B, such as sidewall 72A.

The whorl electrode 142 starts at the center of the sidewall 72A and winds gradually outward to form a whorl pattern. In this case, the whorl pattern is not circular but rectangular in accordance with the rectangular shape of the sidewall 72A. The center of the whorl pattern is connected to an RF power supply 68 and the outer end of the whorl pattern is grounded. The whorl electrode 142 is present essentially all over the sidewall 72A.

This modified embodiment can exhibit an effect of the same kind as the first embodiment described above. Further, since the length of the electrode 66 set up along the plasma generation box 64 is increased, it is possible to increase the plasma density, to expand the plasma generation area, and to make the plasma density more uniform.

In the thirty-first modified embodiment shown in FIG. 24B, the electrode 66 also comprises a whorl electrode 142 forming a whorl pattern. Specifically, the plasma generation box 64 has a curved surface thus shaped in a cross section, and the whorl electrode 142 is disposed along the curved surface. The plasma generation box 64 has been prepared to have an outer surface as the curved surface 144, which is curved in a cross section, e.g., to form a circular arc in a cross section as in this embodiment. The whorl electrode 142 disposed along the curved surface 144 is similar to that shown in FIG. 24A. This modified embodiment can also exhibit the same effect as the modified embodiment shown in FIG. 24A.

In the thirty-second modified embodiment shown in FIG. 24C, the electrode 66 also comprises a whorl electrode 142 forming a whorl pattern. Specifically, the plasma generation box 64 has a curved surface thus shaped in a cross section. The electrode 66 is connected to an RF power supply 68 at the center of the curved surface, and is divided into two whorl electrodes 142 at this center, which wind in the same direction to form whorl patters.

As in the modified embodiment shown in FIG. 24B, the plasma generation box 64 has been prepared to have an outer surface as the curved surface 144, which is curved in a cross section, e.g., to form a circular arc in a cross section as in this embodiment. The two whorl electrodes 142 form rectangular whorl patters along the curved surface 144. The outer ends of the two whorl electrodes 142 are respectively grounded.

This modified embodiment can exhibit an effect of the same kind as the first embodiment described above. Further, since the length of the electrode 66 set up along the plasma generation box 64 is increased, it is possible to increase the plasma density, to expand the plasma generation area, and to make the plasma density more uniform.

In the embodiments described above, the plasma process is exemplified by a film formation process of the plasma ALD type. Alternatively, the present invention may be applied to any one of the processes using plasma, such as a plasma CVD process, plasma reformation process, plasma oxidation/diffusion process, plasma sputtering process, or plasma nitridation process.

In the embodiments described above, the target object is exemplified by a semiconductor wafer. Alternatively, the present invention may be applied to another target object, such as a glass substrate, LCD substrate, or ceramic substrate.

According to the embodiments described above, there is provided an apparatus arranged as follows.

[1] A plasma processing apparatus for performing a plasma process on a plurality of target objects, the apparatus comprising a cylindrical process container configured to be vacuum-exhausted; a holder configured to support the target objects and to be loaded and unloaded to and from the process container; a gas supply system configured to supply a gas into the process container; and an activation mechanism configured to activate the gas by plasma, wherein the activation mechanism includes a plasma generation box disposed on the process container along a longitudinal direction thereof, an ICP electrode provided to the plasma generation box, and an RF power supply connected to the ICP electrode.

[2] The apparatus according to [1], wherein the gas supply system includes a gas nozzle configured to supply the gas and disposed inside the plasma generation box.

[3] The apparatus according to either one of [1] and [2], wherein the plasma generation box is disposed outside and along a sidewall of the process container.

[4] The apparatus according to either one of [1] and [2], wherein the plasma generation box is disposed inside and along a sidewall of the process container.

[5] The apparatus according to any one of [1] to [4], wherein the RF power supply is set to have an RF power frequency within a range of 4 MHz to 27.12 MHz.

[6] The apparatus according to any one of [1] to [5], wherein an electrostatic shield is interposed between the plasma generation box and the electrode.

[7] The apparatus according to any one of [1] to [6], wherein the electrode extends along a side surface of the plasma generation box.

[8] The apparatus according to any one of [1] to [6], wherein the electrode extends along opposite side surfaces of the plasma generation box while being bent back at an end of the plasma generation box.

[9] The apparatus according to any one of [1] to [6], wherein the electrode makes a half turn, one turn, or a plurality of turns around a sidewall or sidewalls of the plasma generation box.

[10] The apparatus according to any one of [1] to [6], wherein the plasma generation box is formed by a cover having a U-shaped cross-section, which includes a pair of sidewalls and a backside wall connecting ends of the sidewalls.

[11] The apparatus according to [10], wherein the electrode has a meandering shape curved at a plurality of positions.

[12] The apparatus according to [11], wherein the electrode extends along the sidewalls in a longitudinal direction thereof while it is meandering with circular arcs that face alternately opposite sides to form the meandering shape.

[13] The apparatus according to [11], wherein the electrode forms the meandering shape by repeating such figuration that the electrode extends from one of the opposite sidewalls through the backside wall to the other sidewall, then, the electrode is curved along this latter sidewall and is bent back from this sidewall through the backside wall to the former sidewall, and then, the electrode is curved along this former sidewall and is bent back again from this sidewall.

[14] The apparatus according to [11], wherein the electrode forms the meandering shape by repeating such figuration that the electrode extends from one of the opposite sidewalls through the backside wall to the other sidewall, then, the electrode is curved with a smaller fold width along this latter sidewall and is bent back from this sidewall through the backside wall to the former sidewall, and then, the electrode is curved with a larger fold width along this former sidewall and is bent back again from this sidewall, while this figuration is performed from each of the opposite sidewalls to the other.

[15] The apparatus according to [11], wherein the electrode forms the meandering shape such that the electrode extends from one end of the backside wall to one of the opposite sidewalls, and is curved along this former sidewall and is bent back to the backside wall, and then, the electrode is curved along the backside wall and is bent back again to the former sidewall, while this figuration is repeated up to the other end of the backside wall; and then, the electrode extends from the other end of the backside wall to the other sidewall, and is curved along this latter sidewall and is bent back to the backside wall, and then, the electrode is curved along the backside wall and is bent back again to the latter sidewall, while this figuration is repeated down to the first one end of the backside wall.

[16] The apparatus according to [10], wherein the electrode comprises a main electrode making one turn around the sidewalls in a longitudinal direction thereof and a plurality of branch electrodes branching from the main electrode along the opposite sidewalls and extending toward the backside wall.

[17] The apparatus according to [16], wherein the branch electrodes along the opposite sidewalls face each other through the opposite sidewalls and extend to the backside wall at distal ends.

[18] The apparatus according to [16], wherein branch electrodes from one sidewall and branch electrodes from the other sidewall are alternately arrayed, and the branch electrodes extend from each of the sidewalls through the backside wall to the other of the sidewalls at distal ends.

[19] The apparatus according to [16], wherein the electrode comprises a main electrode making one turn along the backside wall in a longitudinal direction thereof and a plurality of branch electrodes branching from the main electrode and extending toward the opposite sidewalls.

[20] The apparatus according to [10], wherein the electrode comprises a plurality of partly opened ring electrodes connected in series.

[21] The apparatus according to [20], wherein the electrode comprises a plurality of partly opened ring electrodes arrayed along the opposite sidewalls on a straight line in a longitudinal direction thereof, and connector electrodes disposed separately from the sidewalls and connecting ends of the ring electrodes adjacent to each other in an array direction, so that the ring electrodes are connected in series as a whole.

[22] The apparatus according to [20], wherein the electrode comprises a plurality of partly opened ring electrodes arrayed along the backside wall in a longitudinal direction thereof, and connector electrodes disposed separately from the backside wall and connecting ends of the ring electrodes adjacent to each other in an array direction, so that the ring electrodes are connected in series as a whole.

[23] The apparatus according to [10], wherein the electrode makes two rounds in a longitudinal direction of the opposite sidewalls.

[24] The apparatus according to [23], wherein the electrode is wound around the opposite sidewalls in a longitudinal direction thereof to make two rounds.

[25] The apparatus according to [23], wherein the electrode makes one round along one of the opposite sidewalls in the longitudinal direction thereof, while electrode portions are separated from each other, and then, the electrode makes one round along the other sidewalls in a longitudinal direction thereof, while electrode portions are separated from each other, so as to make two rounds as a whole.

[26] The apparatus according to [10], wherein the electrode makes one turn around the opposite sidewalls, and electrode portions are curved to project most at a portion corresponding to the center of the plasma generation box in a vertical direction, toward a center of the process container.

[27] The apparatus according to [10], wherein the electrode is disposed along one of the opposite sidewalls.

[28] The apparatus according to [27], wherein the electrode makes a half turn along one of the opposite sidewalls in a longitudinal direction thereof, while the electrode is connected to the RF power supply at a lower end and grounded at an upper end.

[29] The apparatus according to [27], wherein the electrode makes one round along one of the opposite sidewalls in a longitudinal direction thereof.

[30] The apparatus according to [27], wherein the electrode makes a half turn along one of the opposite sidewalls in a longitudinal direction thereof, while the electrode is connected to the RF power supply at a lower end, and is bent back at another end downward to be separate from the sidewall and grounded.

[31] The apparatus according to [10], wherein the electrode comprises a wide electrode having a predetermined width.

[32] The apparatus according to [31], wherein wide electrode makes one turn around the opposite sidewalls in a longitudinal direction thereof.

[33] The apparatus according to [31], wherein the electrode comprises a main electrode extending along one of the opposite sidewalls and a wide electrode extending along the other sidewall in a longitudinal direction thereof, while the main electrode and the wide electrode are connected to each other at an upper end.

[34] The apparatus according to [33], wherein the wide electrode is grounded at a lower end.

[35] The apparatus according to [31], wherein the electrode comprises a main electrode extending along one of the opposite sidewalls in a longitudinal direction thereof and a wide electrode for grounding which extends along the other sidewall in a longitudinal direction thereof, while the main electrode and the wide electrode for grounding are electrically separated from each other.

[36] The apparatus according to any one of [32] to [35], wherein the wide electrode comprises a metal plate, metal punching plate, or metal mesh.

[37] The apparatus according to [10], wherein the electrode comprises a diverging node from which two main branch electrodes diverge.

[38] The apparatus according to [37], wherein the electrode is connected to the RF power supply at a center in a longitudinal direction of one of the opposite sidewalls, and includes the diverging node at this center from which the electrode is divided into a main branch electrode extending upward and a main branch electrode extending downward, which are bent back toward the other sidewall and are connected to each other at a center in a longitudinal direction of the other sidewall.

[39] The apparatus according to [37], wherein the electrode is connected to the RF power supply at a bottom of the plasma generation box, and is divided into two main branch electrodes from the diverging node at the bottom such that the main branch electrodes extend along one of the sidewalls in a longitudinal direction thereof, and are bent back at a top of the plasma generation box, and then, the main branch electrodes extend along the other sidewall in a longitudinal direction thereof and are grounded at a lower end.

[40] The apparatus according to [37], wherein the electrode is connected to the RF power supply at a bottom of the plasma generation box, and is divided into two main branch electrodes from the diverging node at the bottom such that the main branch electrodes extend along one of the sidewalls in a longitudinal direction thereof, and are bent back at a top of the plasma generation box, and then, the main branch electrodes are joined into one electrode at the top, which extends along the other sidewall in a longitudinal direction thereof and is grounded at a lower end.

[41] The apparatus according to [37], wherein the electrode is connected to the RF power supply at a bottom of the plasma generation box, and is divided into two main branch electrodes from the diverging node at the bottom such that the two main branch electrodes respectively extend along the respective sidewalls in a longitudinal direction thereof, and are respectively bent back toward the opposite sides at a top of the plasma generation box, and then, the two main branch electrodes respectively extend along the respective sidewalls in a longitudinal direction thereof, and are grounded at a lower end.

[42] The apparatus according to [37], wherein the electrode is connected to the RF power supply at a bottom of the plasma generation box, and is divided into two main branch electrodes from the diverging node at the bottom such that the two main branch electrodes respectively extend along the respective sidewalls in a longitudinal direction thereof, and are bent back at a top of the plasma generation box, and then, the main branch electrodes are joined into one electrode at the top, which extends along the backside wall in a longitudinal direction thereof and is grounded at a lower end.

[43] The apparatus according to [37], wherein the electrode is connected to the RF power supply at a bottom of the plasma generation box, and is divided into two main branch electrodes from the diverging node at the bottom such that the two main branch electrodes respectively extend along the respective sidewalls in a longitudinal direction thereof, and are respectively grounded at the top of the plasma generation box while being separated from the sidewalls.

[44] The apparatus according to [37], wherein the electrode is connected to the RF power supply at a bottom of the plasma generation box, and is divided into two main branch electrodes from the diverging node at the bottom such that the main branch electrodes extend along one of the sidewalls in a longitudinal direction thereof while being separated from each other by a predetermined distance, and then, the main branch electrodes are bent back outward at a top of the sidewalls to be separate from the sidewalls, and extend downward to a grounded portion.

[45] The apparatus according to [10], wherein the electrode comprises a main electrode making one turn around the opposite sidewalls in a longitudinal direction thereof and a plurality of bypass electrodes extending from the main electrode in a width direction of the opposite sidewalls through the backside wall, so as to connect portions of the main electrode along the opposite sidewalls to each other.

[46] The apparatus according to [10], wherein the electrode includes a main electrode connected to the RF power supply at a bottom of the plasma generation box, extending along the backside wall in a longitudinal direction thereof, and connected to a plurality of loop electrodes extending to the opposite sidewalls to form loops; and main branch electrodes branching at a top of the plasma generation box and respectively extending along the respective sidewalls in a longitudinal direction thereof to a grounded portion.

[47] The apparatus according to [10], wherein the electrode comprises a whorl electrode forming a whorl pattern.

[48] The apparatus according to [47], wherein the whorl electrode is disposed along one of the opposite sidewalls.

[49] The apparatus according to [47], wherein the plasma generation box has a curved surface thus shaped in a cross section, and the whorl electrode is disposed along the curved surface.

[50] The apparatus according to [47], wherein the plasma generation box has a curved surface thus shaped in a cross section, and the electrode is connected to the RF power supply at a center of the curved surface, and is divided into two the whorl electrodes at the center, which wind in the same direction to form whorl patters.

[51] The apparatus according to [10], wherein two RF power supplies and two electrode are disposed such that one of the two electrodes extends along one of the opposite sidewalls in a longitudinal direction thereof while a lower end thereof is connected to one of the two RF power supplies and an upper end thereof is grounded; and the other electrode extends along the other sidewall in a longitudinal direction thereof while an upper end thereof is connected to the other RF power supply and a lower end thereof is grounded.

[52] The apparatus according to any one of [10] to [51], wherein the electrode is provided with a capacitor along its path in a longitudinal direction thereof.

[53] The apparatus according to any one of [1] to [52], wherein a portion of the electrode nearest to the target objects is distant from the target objects by a distance of 40 mm or more.

[54] The apparatus according to any one of [1] to [53], wherein a heater is disposed around the process container to heat the target objects.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A vertical plasma processing apparatus for performing a plasma process on a plurality of target objects, together at a time, the apparatus comprising:

a vertically elongated process container having a process field configured to accommodate the target objects and to be set in an airtightly state;

a holder configured to stack thereon the plurality of target objects at intervals in a vertical direction with a holding span having a predetermined vertical length inside the process field;

a gas supply system configured to supply a process gas into the process container;

an exhaust system configured to exhaust gas from inside the process container; and an activation mechanism configured to turn the process gas into plasma, wherein the activation mechanism includes, a vertically elongated plasma generation box having a rectangular shape in a cross-section attached to outside the process container extending vertically entirely over the process field, and defining a plasma generation area airtightly communicating with the process field, such that the plasma generation box includes an opening having a vertical length entirely over the holding span and connecting the plasma generation area to the process field, first and second sidewalls extending outward from the process container in a radial direction one on either side of the opening and facing each other, and a backside wall that connects outer ends of the first and second sidewalls to each other, an inductively coupled plasma (ICP) electrode provided to the plasma generation box to generate inductively coupled plasma of the process gas in the plasma generation area, the ICP electrode being an electrode band extending in a vertical direction and curved at a plurality of positions to form first and second meandering portions respectively along the outside of the first and second sidewalls vertically entirely over the holding span, and the electrode band including a bent back portion connecting the first and second meandering portions to each other at one vertical end of the plasma generation box and further including first and second terminal ends respectively connected to the first and second meandering portions at the other vertical end of the plasma generation box, and a radio frequency (RF) power supply connected to the ICP electrode through an electric feed circuit and configured to apply an RF power across the first and second terminal ends, and wherein the gas supply system is configured to deliver the process gas directly inside the plasma generation box such that the process gas is supplied to the process field through a position inside the plasma generation box corresponding to the ICP electrode.

2. The apparatus according to claim 1, wherein the ICP electrode is disposed to be distant from the target objects on the holder by a length of 40 mm or more at a nearest position.

3. The apparatus according to claim 1, wherein the first and second meandering portions are formed of circular arcs connected to each other in a vertical direction and facing alternately opposite sides.

4. The apparatus according to claim 3, wherein the circular arcs have substantially a constant radius.

5. The apparatus according to claim 4, wherein each of the circular arcs is formed of a circular arc cut out by an angle of $\pi/2$ to $3\pi/2$ from a circle having the radius.

6. The apparatus according to claim 4, wherein the electrode band of the ICP electrode has a width of 2 to 10 mm and meanders to form the circular arcs.

7. The apparatus according to claim 4, wherein the radius is 5 to 50 mm.

8. The apparatus according to claim 3, wherein the first and second meandering portions have curved directions of the electrode band reverse to each other at corresponding heights.

9. The apparatus according to claim 1, wherein the first and second meandering portions are formed of circular arcs connected to each other in a vertical direction and facing alternately opposite sides, and the first and second meandering portions form a substantially symmetric shape with respect to an intermediate portion therebetween.

10. The apparatus according to claim 9, wherein the first and second meandering portions have curved directions of the electrode band reverse to each other at corresponding heights, such that each pair of reverse circular arcs of the first and second meandering portions positioned at the same height define a circular area to provide a high density plasma area.

11. The apparatus according to claim 1, wherein the electric feed circuit includes a matching circuit portion disposed between the ICP electrode and the RF power supply and configured to perform impedance matching.

12. The apparatus according to claim 1, wherein an electrostatic shield is interposed between the plasma generation box and the ICP electrode and includes a conductive body insulated from the ICP electrode and grounded.

13. The apparatus according to claim 12, wherein the electrostatic shield includes a plurality of slits formed in a portion of the electrostatic shield interposed between the plasma generation box and the ICP electrode.

14. The apparatus according to claim 12, wherein the electrostatic shield includes a plurality of rod electrodes interposed between the plasma generation box and the ICP electrode.

15. The apparatus according to claim 1, wherein the gas supply system includes a gas distribution nozzle disposed inside the plasma generation box at a position more distant from the opening than a position corresponding to the ICP electrode is, and the gas distribution nozzle includes a plurality of gas spouting holes formed thereon to laterally spout the process gas toward the process field.

16. The apparatus according to claim 1, wherein the RF power has a frequency within a range of 4 MHz to 27.12 MHz.

17. The apparatus according to claim 1, wherein the apparatus is configured to perform a film formation process, and the gas supply system is configured to supply a silicon-containing gas and a reactive gas, which is the process gas and consists of a nitriding gas or an oxidizing gas, into the process field, such that the silicon-containing gas is supplied into the process field not through the plasma generation area and the reactive gas is supplied into the process field through the plasma generation area.

* * * * *